(12) United States Patent
Ichiryu et al.

(10) Patent No.: US 8,367,488 B2
(45) Date of Patent: Feb. 5, 2013

(54) MANUFACTURING METHOD OF FLEXIBLE SEMICONDUCTOR DEVICE

(75) Inventors: Takashi Ichiryu, Osaka (JP); Seiichi Nakatani, Osaka (JP); Koichi Hirano, Osaka (JP)

(73) Assignee: Panasonic Corporation, Osaka (JP)

( * ) Notice: Subject to any disclaimer, the term of this patent is extended or adjusted under 35 U.S.C. 154(b) by 231 days.

(21) Appl. No.: 13/054,049

(22) PCT Filed: Feb. 5, 2010

(86) PCT No.: PCT/JP2010/000715
§ 371 (c)(1),
(2), (4) Date: Jan. 13, 2011

(87) PCT Pub. No.: WO2010/134234
PCT Pub. Date: Nov. 25, 2010

(65) Prior Publication Data
US 2011/0121298 A1 May 26, 2011

(30) Foreign Application Priority Data

May 19, 2009 (JP) ................................. 2009-120665

(51) Int. Cl.
*H01L 29/786* (2006.01)
*H01L 21/336* (2006.01)
(52) U.S. Cl. ... 438/155; 438/151; 257/57; 257/E21.412; 257/E29.289
(58) Field of Classification Search .................. 438/151, 438/155; 257/57, E21.412, E29.289
See application file for complete search history.

(56) References Cited

U.S. PATENT DOCUMENTS

| 5,981,970 | A | 11/1999 | Dimitrakopoulos et al. |
| 2004/0029364 | A1 | 2/2004 | Aoki et al. |
| 2010/0012936 | A1 | 1/2010 | Hirano et al. |

FOREIGN PATENT DOCUMENTS

| EP | 2 178 110 A1 | 4/2010 |
| EP | 2 178 126 A1 | 4/2010 |
| JP | 10-270712 | 10/1998 |
| JP | 2003-258261 | 9/2003 |
| JP | 2003-318120 | 11/2003 |
| JP | 2005-123290 | 5/2005 |
| JP | 2005-166742 | 6/2005 |
| JP | 2005-294300 | 10/2005 |
| JP | 2006-186294 | 7/2006 |
| JP | 2007-067263 | 3/2007 |
| JP | 2007-073857 | 3/2007 |
| WO | WO 2009/019864 A1 | 2/2009 |
| WO | WO 2009/019865 A1 | 2/2009 |
| WO | WO 2009/069248 A1 | 6/2009 |

*Primary Examiner* — Long Pham
(74) *Attorney, Agent, or Firm* — McDermott Will & Emery LLP

(57) ABSTRACT

A method includes the steps of preparing a multilayer film 80 formed by sequentially stacking a first metal layer 10, an inorganic insulating layer 20, a semiconductor layer 30, and a second metal layer 40; forming a source electrode 42*s* and a drain electrode 42*d* comprised of the second metal layer 40 by etching the second metal layer 40; pressure-bonding a resin layer 50 onto a surface of the multilayer film 80 provided with the source electrode 42*s* and the drain electrode 42*d* to burry the source electrode 42*s* and the drain electrode 42*d* in the resin layer 50; and forming a gate electrode 10*g* comprised of the first metal layer 10 by etching the first metal layer 10. The inorganic insulating layer 20*g* functions as a gate insulating film. The semiconductor layer 30 functions as a channel.

16 Claims, 21 Drawing Sheets

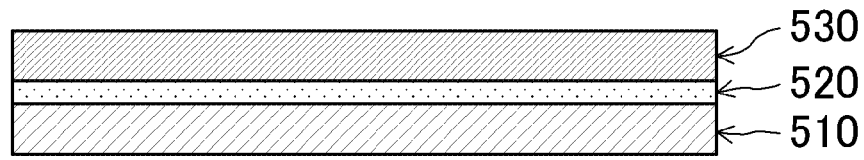
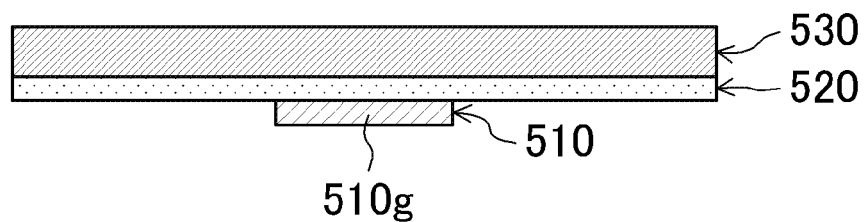
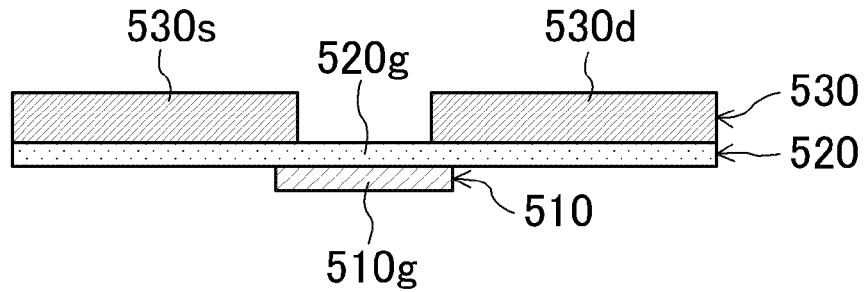
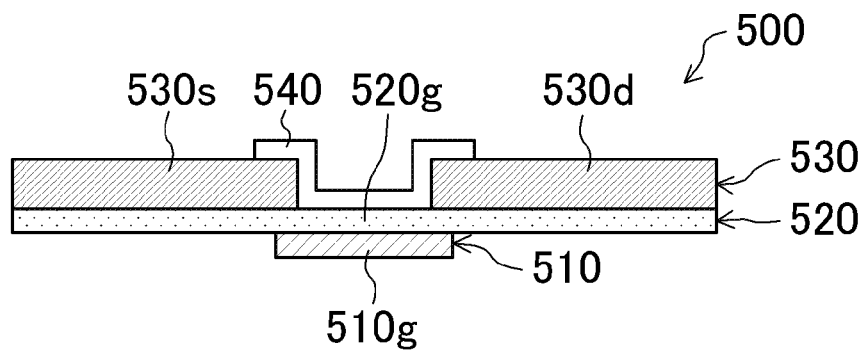

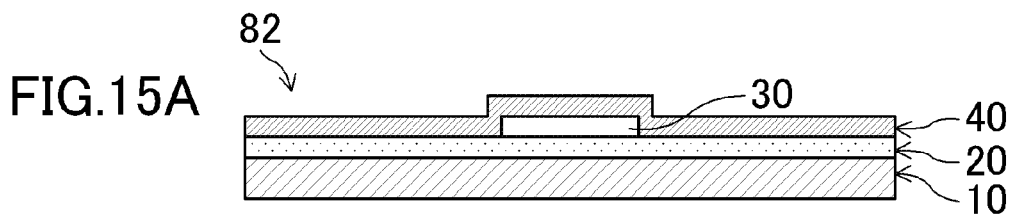
FIG.15A
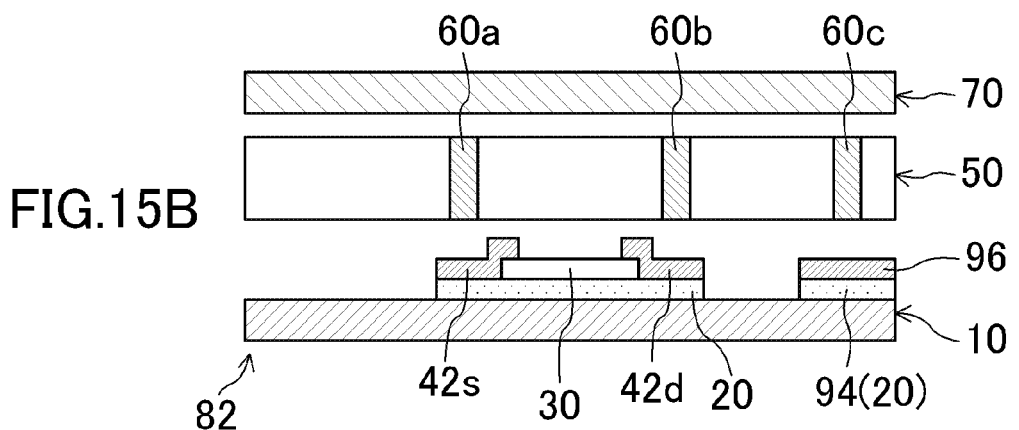
FIG.15B
FIG.15C
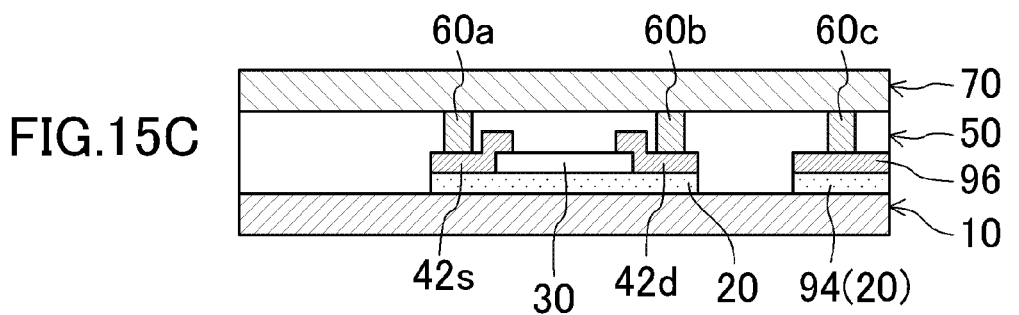
FIG.15D
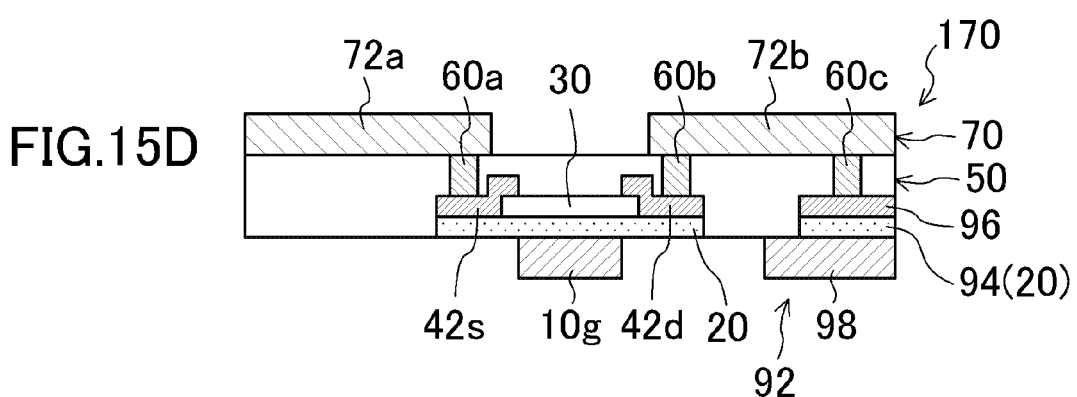

MANUFACTURING METHOD OF FLEXIBLE SEMICONDUCTOR DEVICE

RELATED APPLICATIONS

This application is the U.S. National Phase under 35 U.S.C. §371 of International Application No. PCT/JP2010/000715, filed on Feb. 5, 2010, which in turn claims the benefit of Japanese Application No. 2009-120665, filed on May 19, 2009, the disclosures of which applications are incorporated by reference herein.

TECHNICAL FIELD

The present disclosure relates to manufacturing methods of flexible semiconductor devices.

BACKGROUND ART

With a spread of information terminals, flat panel displays have been increasingly demanded as displays for computers. Furthermore, with the progress of information technology, information which was provided by paper media is increasingly computerized, and electronic paper or digital paper have been increasingly demanded as display media for mobile devices which are thin, lightweight and easily portable (see, e.g., Patent Document 1).

Generally, in a flat panel display, a display medium is formed using a device utilizing liquid crystals, organic electroluminescence (organic EL), electrophoresis, and the like. In such display media, technology with an active matrix device (thin-film transistor (TFT) device) as an image driving element is primarily used to ensure uniformity of screen brightness and a high frame rate. For example, in a conventional computer display, TFT devices are formed on the surface; and liquid crystals, organic EL devices, and the like are encapsulated.

The TFT devices may be primarily made of semiconductor such as amorphous silicon (a-Si) and polysilicon (p-Si). Such Si semiconductor devices (including metal films as necessary) are stacked to be a multilayer; and source, drain, and gate electrodes are sequentially formed on a substrate to manufacture a TFT device.

Formation of a TFT device made of such a Si material includes a high-temperature process, and thus, a substrate is limited to a material resistant to the process temperature. Therefore, in practice, the substrate needs to be made of a material with excellent thermal resistance, e.g., a glass substrate. Note that a quartz substrate may also be used, but it is expensive and causes cost problems when increasing the size of the display. Therefore, a glass substrate is generally used as the substrate on which a TFT device is formed.

However, a thin display formed by using a glass substrate is heavy and less flexible, and thus, may be damaged by impact of falling. This is undesirable when trying to meet demands for thin portable displays in accordance with the progress of the information technology.

In order to satisfy the demands for lightweight and thin displays, semiconductor devices (flexible semiconductor devices) including TFT devices on resin substrates (plastic substrates) have been developed in terms of increasing flexibility of the substrates and reducing the weight.

For example, Patent Document 2 teaches manufacturing a TFT device on a support member (e.g., glass substrate) by a process substantially the same as a conventional process, removing the TFT device from the glass substrate, and transferring the TFT device onto a resin substrate.

Patent Document 3 teaches directly forming a TFT device on a resin substrate.

CITATION LIST

Patent Document

PATENT DOCUMENT 1: Japanese Patent Publication No. 2007-67263
PATENT DOCUMENT 2: Japanese Patent Publication No. 2005-294300
PATENT DOCUMENT 3 Japanese Patent Publication No. 2006-186294

SUMMARY OF THE INVENTION

Technical Problem

However, in the manufacture of a TFT device by the transferring, the step of removing the support member (glass substrate) is problematic. Specifically, the step of removing the glass substrate from a resin substrate requires, for example, processing for reducing adhesiveness between the glass substrate and the TFT device; or processing for forming a release layer between the glass substrate and the TFT device, and then physically or chemically removing the release layer. Such processing adds complexity to the manufacturing process, thereby causing problems in productivity.

On the other hand, in the method of directly forming a TFT device on a resin substrate, process temperature needs to be held low, since the resin substrate has low thermal resistance. Thus, a TFT device directly formed on a resin substrate has poor properties compared to a TFT device formed on a glass substrate. Considering a circuit as a whole, interconnection resistance is high, since interconnects formed by such a process are thin and often made of composite materials. Therefore, a voltage drop occurs in the circuit, thereby causing difficulties in obtaining desired TFT performance, device characteristics, and reliability.

The present inventors have addressed to the above problems of the flexible semiconductor devices not only by an extension of conventional techniques but also from new points of view, and tried to find a solution. The present invention was made in view of the above-described problems. It is an objective of the present invention to provide a manufacturing method of a flexible semiconductor device which provides high performance and excellent productivity.

Solution to the Problem

In order to address the problems, the present invention uses as a base material, a multilayer film, which is prepared in advance and is formed by sequentially stacking a first metal layer, an inorganic insulating layer, a semiconductor layer, and a second metal layer, in a manufacturing method of a flexible semiconductor device. The first metal layer and the second metal layer are processed to form a gate electrode and source/drain electrodes. A resin layer is pressure-bonded onto a surface of the multilayer film provided with the source/drain electrodes to burry the source/drain electrodes in the resin layer. The inorganic insulating layer functions as a gate insulating film, and the semiconductor layer functions as a channel. Such a manufacturing method of a thin-film transistor is provided in the present invention. By the method, a large-area flexible semiconductor device including a thin-film transistor using a resin layer as a base member can be easily formed without any high temperature process.

Specifically, according to one aspect of the present invention, a manufacturing method of a flexible semiconductor device includes the steps of: (a) preparing a multilayer film formed by sequentially stacking a first metal layer, an inorganic insulating layer, a semiconductor layer, and a second metal layer; (b) forming a source electrode and a drain electrode comprised of the second metal layer by etching a part of the second metal layer; (c) pressure-bonding a resin layer onto a surface of the multilayer film provided with the source electrode and the drain electrode to burry the source electrode and the drain electrode in the resin layer; and (d) forming a gate electrode comprised of the first metal layer by etching a part of the first metal layer. The inorganic insulating layer on the gate electrode functions as a gate insulating film. The semiconductor layer between the source electrode and the drain electrode on the inorganic insulating layer functions as a channel.

According to another aspect of the present invention, the step (c) preferably includes the steps of (c1) preparing the resin layer provided with a plurality of conductive interlayer connections penetrating both surfaces, and (c2) pressure-bonding the resin layer onto the surface of the multilayer film provided with the source electrode and the drain electrode to burry the source electrode and the drain electrode in the resin layer, and to connect the source electrode and the drain electrode to the interlayer connections. Thus, potential of the source electrode and the drain electrode buried in the resin layer can be easily obtained on the surface of the resin layer.

According to another aspect of the present invention, it is preferable that the manufacturing method further includes after the step (c), the step of pressure-bonding a third metal layer onto a surface of the resin layer, and then etching the third metal layer to form an interconnect. It is preferable that the interconnect is electrically connected to the source electrode and the drain electrode and/or the first metal layer through the interlayer connections. Thus, the source electrode and the drain electrode buried in the resin layer can be easily connected to the interconnects formed on the surface of the resin layer.

According to another aspect of the present invention, in the step (b), an upper electrode of a capacitor comprised of the second metal layer is formed together with the source electrode and the drain electrode by etching a part of the second metal layer. In the step (d), a lower electrode of the capacitor comprised of the first metal layer is formed together with the gate electrode by etching a part of the first metal layer. The inorganic insulating layer between the upper electrode and the lower electrode functions as a dielectric layer of the capacitor. Thus, a flexible semiconductor device including a thin-film transistor and a capacitor can be easily formed.

Advantages of the Invention

The present invention uses as a base material, a multilayer film formed by sequentially stacking a first metal layer, an inorganic insulating layer, a semiconductor layer, and a second metal layer. The first metal layer and the second metal layer are processed to form a gate electrode and source/drain electrodes. At the same time, a resin layer is pressure-bonded onto the surface of the multilayer film provided with the source/drain electrodes to burry the source/drain electrodes in the resin layer. The inorganic insulating layer functions as a gate insulating film, and a semiconductor layer functions as a channel. As a result, a large-area flexible semiconductor device including a high performance thin-film transistor can be easily formed.

BRIEF DESCRIPTION OF THE DRAWINGS

FIGS. 1(a)-1(d) are cross-sectional views illustrating basic steps in a manufacturing method of a flexible semiconductor device shown in the specification of PCT International Application PCT/JP2008/002759.

FIG. 5 illustrates the structure of a flexible semiconductor device manufactured by the method of the first embodiment.

FIGS. 15(a)-15(d) are cross-sectional views illustrating steps in a manufacturing method of a flexible semiconductor device in an eighth embodiment of the present invention.

FIG. 16 illustrates the structure of a flexible semiconductor device in a ninth embodiment of the present invention.

DESCRIPTION OF EMBODIMENTS

Figure 2A:
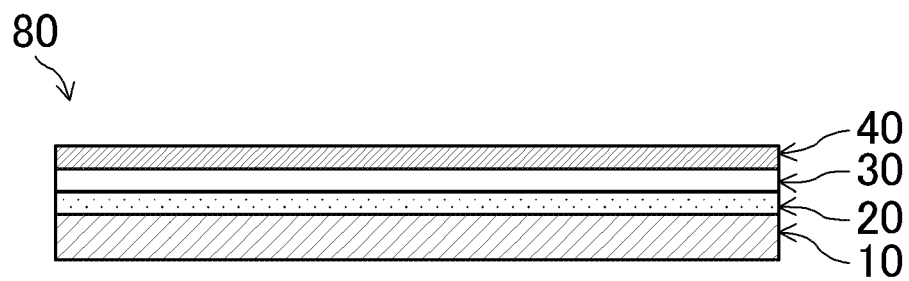
FIGS. 2(a)-2(c) are cross-sectional views illustrating steps in a manufacturing method of a flexible semiconductor device in a first embodiment of the present invention.

The present inventors have researched a manufacturing method of a flexible semiconductor device applicable to a thin display, and suggested in the specification of PCT International Application PCT/JP2008/002759, a manufacturing method of a flexible semiconductor device with excellent productivity.

FIGS. 1(a)-(d) are cross-sectional views illustrating basic steps in the manufacturing method of a flexible semiconductor device 500 shown in the above specification.

First, as shown in FIG. 1(a), a multilayer film, which is three-layer clad foil formed by stacking a first metal layer 510 and a second metal layer 530 on respective sides of an inorganic insulating layer 520, is prepared. Then, as shown in FIG. 1(b), a gate electrode 510g of a thin-film transistor is formed by etching a part of the first metal layer 510.

Next, as shown in FIG. 1(c), a source electrode 530s and a drain electrode 530d are formed in parts corresponding to the gate electrode 510g by etching a part of the second metal layer 530. In this embodiment, the source electrode 530s and the drain electrode 530d may be formed first, and then the gate electrode 510g may be formed. In the both cases, the inorganic insulating layer 520 functions as a base member, thereby enabling formation of the gate electrode 510g as well as the source electrode 530s and the drain electrode 530d.

Then, as shown in FIG. 1(d), a semiconductor layer 540 is formed in contact with the source electrode 530s and the drain electrode 530d, and on the gate electrode 510g with the inorganic insulating layer 520 interposed therebetween. The inorganic insulating layer 520g on the gate electrode 510g functions as a gate insulating film. The semiconductor layer 540 between the source electrode 530s and the drain electrode 530d on the inorganic insulating layer 520g functions as a channel. As such, a flexible semiconductor device including a thin-film transistor is completed.

As described above, a multilayer film being three-layer clad foil formed by stacking the first metal layer 510 and the second metal layer 530 on the respective sides of the inorganic insulating layer 520 is prepared in advance. Using the multilayer film as a base material, the first metal layer 510 and the second metal layer 530 are processed to form the gate electrode 510g, the source electrode 530s, and the drain electrode 530d. Then, when the semiconductor layer 540 is formed on the gate electrode 510g by a low temperature process (e.g., printing) with the inorganic insulating layer (gate insulating film) 520 interposed therebetween, the thin-film transistor can be easily formed without any high temperature process. In addition, the inorganic insulating layer 520 of the three-layer clad foil, which is interposed between the first metal layer 510 and the second metal layer 530, functions as a base member, thereby easily forming a flexible semiconductor device including a plurality of thin-film transistors.

After further researching manufacturing methods of the flexible semiconductor device, the present inventors have arrived at a manufacturing method of a flexible semiconductor device providing higher performance and excellent productivity.

Embodiment of the present invention will be described hereinafter with reference to the drawings. In the following drawings, the same reference characters are used to represent elements performing substantially the same functions, for simplicity of explanation. Furthermore, the sizes (length, width, thickness, etc.) in the drawings do not reflect actual sizes. The present invention is not limited to the following embodiments. Variations and modifications are possible without departing from the advantages of the present invention. Furthermore, the embodiments may well be combined.

First Embodiment

FIGS. 2 (a)-(d) are cross-sectional views of a manufacturing method of a flexible semiconductor device 100 in the first embodiment of the present invention.

First, as shown in FIG. 2(a), a multilayer film 80 formed by sequentially stacking a first metal layer 10, an inorganic insulating layer 20, a semiconductor layer 30, and a second metal layer 40, is prepared. The first metal layer 10 and the second metal layer 40 may be made of a same material or different materials. The material of the inorganic insulating layer 20 is not specified, but is preferably a thin film with high dielectric constant, since the inorganic insulating layer functions as a gate insulating film of a thin-film transistor. Furthermore, the material of the semiconductor layer 30 is not specified, but is preferably a thin film with high carrier mobility, since the semiconductor layer 30 functions as a channel of the thin-film transistor. Inorganic semiconductor or organic semiconductor may be used as the material. Note that the multilayer film 80 may be formed by various methods described below.

Figure 2B:
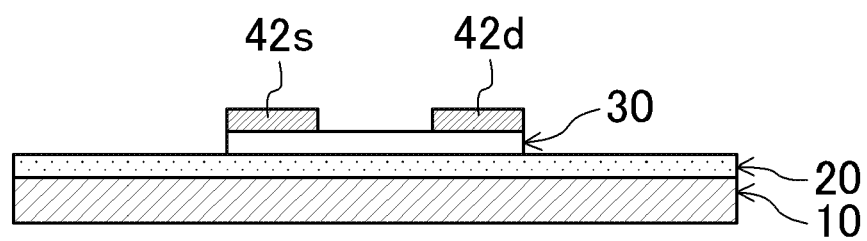

Then, as shown in FIG. 2(b), a source electrode 42s and a drain electrode 42d comprised of the second metal layer 40 are formed by etching a part of the second metal layer 40. After that, the semiconductor layer 30 is removed by etching while retaining the formation region of the thin-film transistor (a region including at least the channel).

Figure 2C:
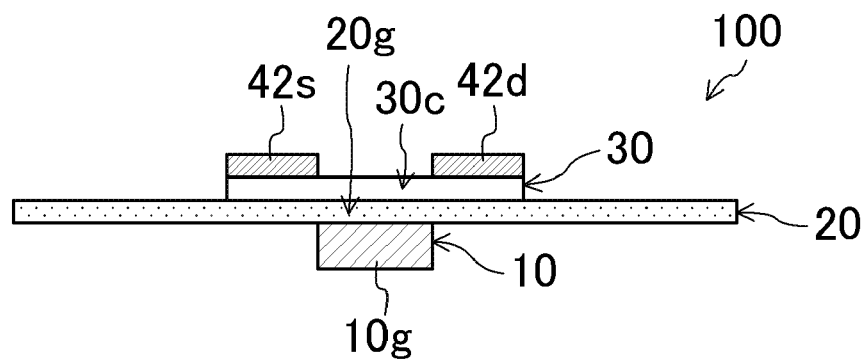

Next, as shown in FIG. 2(c), a gate electrode 10g comprised of the first metal layer 10 is formed by etching a part of the first metal layer 10. An inorganic insulating layer 20g on the gate electrode 10g functions as a gate insulating film. A semiconductor layer 30c between the source electrode 42s and the drain electrode 42d on the inorganic insulating layer 20g functions as a channel. As such, the flexible semiconductor device 100 is completed.

In this embodiment, etchant of the second metal layer 40 and the first metal layer 10 can be selected as appropriate depending on the materials of the metal layers. Either one of wet etching or dry etching may be used. Furthermore, the gate electrode 10g may be formed first, and then the source electrode 42s and the drain electrode 42d may be formed.

As such, the multilayer film 80, which is formed by stacking the first metal layer 10, the inorganic insulating layer 20, the semiconductor layer 30, and the second metal layer 40, is prepared in advance. Using the multilayer film 80 as a base material, the thin-film transistor including the gate electrode 10g, the source electrode 42s, the drain electrode 42d, and the channel 30c can be formed only by the step (low temperature process) of etching the first metal layer 10, the second metal layer 40, and the semiconductor layer 30. Therefore, the flexible semiconductor device can be easily formed without any high temperature process.

In the present invention, the inorganic insulating layer 20 cannot be formed thick, since it functions as a gate insulating film. Thus, when a large-area flexible semiconductor device including a number of thin-film transistors is formed, sufficient strength as a base member cannot be ensured. Furthermore, when a plurality of thin-film transistors are formed, the gate insulating film 20g in the thin-film transistors cannot be separated, since the inorganic insulating layer 20 is used as a base member. Thus, when the thin-film transistors are formed to be close to each other, leakage may occur between the adjacent thin-film transistors.

Figure 3A:
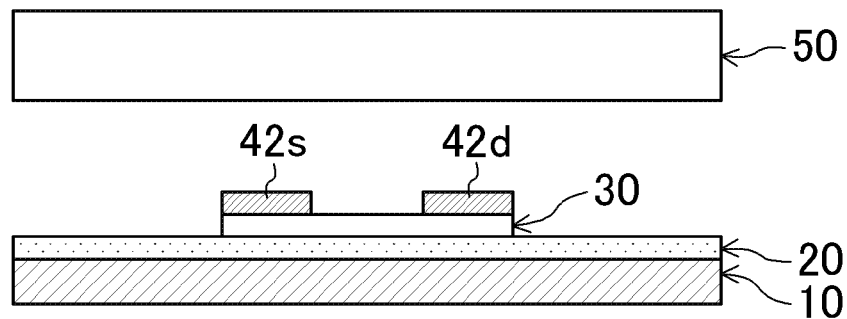
FIGS. 3(a)-3(c) are cross-sectional views illustrating steps in a manufacturing method of a flexible semiconductor device using a resin layer in the first embodiment as a base member.

Thus, as shown in FIG. 3(a), after the step shown in FIG. 2(b), the inorganic insulating layer 20 is removed by etching while retaining the formation region of the thin-film transistor (a region including at least the channel).

Figure 3B:
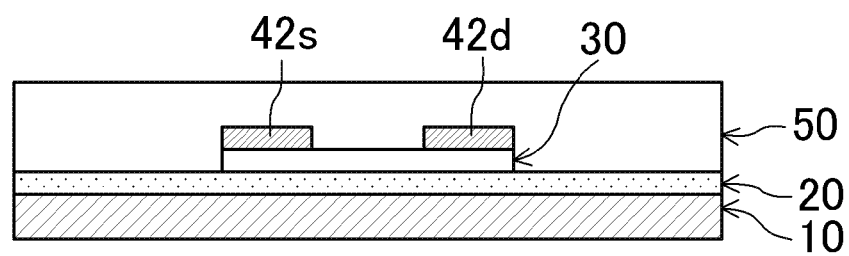
Figure 3C:
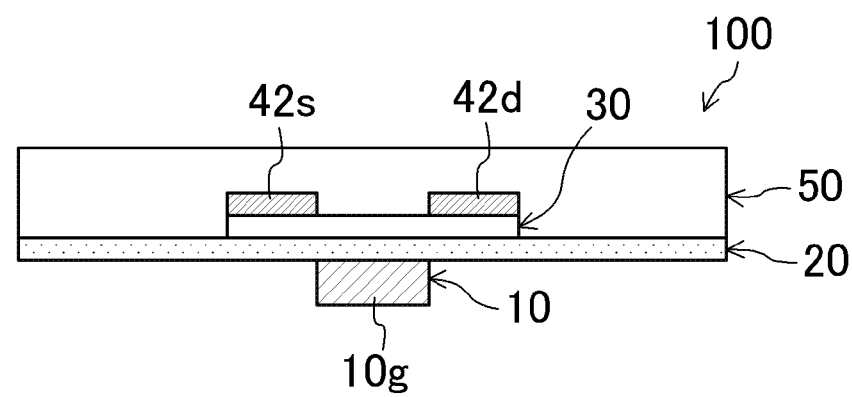

After that, as shown in FIG. 3(b), a resin layer 50 is pressure-bonded onto the surface of the multilayer film provided with the source electrode 42s and the drain electrode 42d to burry the source electrode 42s and the drain electrode 42d in the resin layer 50. At this time, the semiconductor layer 30 and the inorganic insulating layer 20 remaining in the formation region of the thin-film transistor are also buried in the resin layer 50. Thus, instead of the inorganic insulating layer 20, the resin layer 50 having a larger thickness than the inorganic insulating layer 20 can be used as the base member, a large-area flexible semiconductor device including a thin-film transistor with reduced leakage can be easily formed.

The material of the resin layer 50 is not specified, but has preferably sufficient plasticity so that the source electrode 42s and the drain electrode 42d can be buried in the resin layer 50, and has excellent adhesiveness to the second metal layer 40 and the semiconductor layer 30 on at least the surface.

Specific steps in the manufacturing method of the flexible semiconductor device in this embodiment will be described further in detail with reference to FIGS. 4(a)-4(d).

Figure 4A:
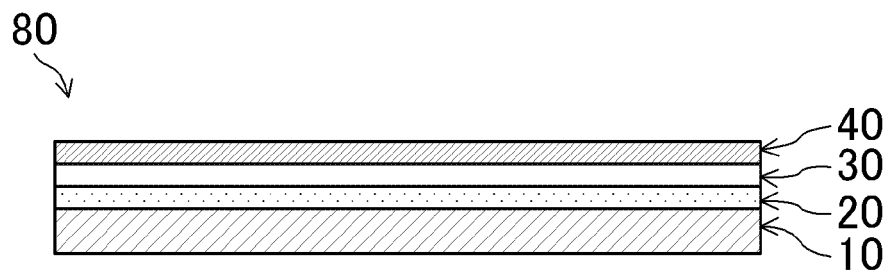
FIGS. 4(a)-4(d) are cross-sectional views illustrating specific steps in the manufacturing method of the flexible semiconductor device in the first embodiment.

First, as shown in FIG. 4(a), the multilayer film 80 is prepared (manufactured, bought, etc.). The multilayer film 80 includes the first metal layer 10, the inorganic insulating layer 20 formed on the upper surface of the first metal layer 10, the semiconductor layer 30 formed on the upper surface of the inorganic insulating layer 20, and the second metal layer 40 formed on the upper surface of the semiconductor layer 30. The first metal layer 10 may be copper foil with a thickness of 12 μm. The inorganic insulating layer 20 may be made of barium titanate with a thickness of 0.8 μm. The semiconductor layer 30 may be a polysilicon film with a thickness of 0.3 μm. The second metal layer 40 may be copper foil with a thickness of 1 μm.

Figure 4B:
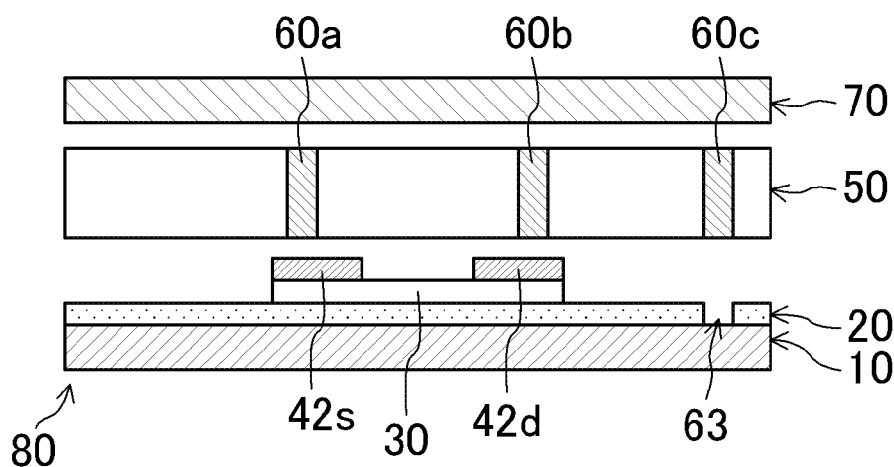

Then, as shown in FIG. 4(b), the source electrode 42s and the drain electrode 42d comprised of the second metal layer 40 are formed by etching the second metal layer 40 in the multilayer film 80. Etchant can be appropriately selected based on e.g., the material of the second metal layer 40. For example, ferric chloride may be used for etching the copper foil. Then, the semiconductor layer 30 is removed by etching while retaining the formation region of the thin-film transistor (a region including at least the channel). Etchant can be appropriately selected based on the material of the semiconductor layer 30. For example, hydrofluoric acid and a nitric acid mixture may be used for etching the polysilicon film. Furthermore, the semiconductor layer 30 may be processed by laser irradiation.

Moreover, a part of the inorganic insulating layer 20 is removed to form an opening 63 particularly exposing the first metal layer 10. The inorganic insulating layer 20 can be removed by for example, laser irradiation, etching, and the like. Etchant can be appropriately selected based on the material of the inorganic insulating layer 20. For example, hydrofluoric acid and a nitric acid mixture can be used for etching titanium composite oxide.

Figure 4C:
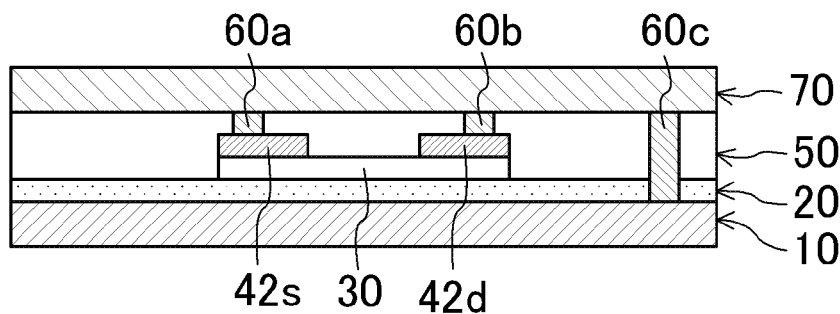

Next, as shown in FIG. 4(c), a resin sheet 50 is formed to cover the surface of the multilayer film 80 provided with the semiconductor layer 30, the source electrode 42s, and the drain electrode 42d. The resin sheet 50 is formed by for example, pressure-bonding (bonding while applying pressure) the multilayer film 80 provided with the semiconductor layer 30, the source electrode 42s, and the drain electrode 42d onto the resin sheet 50. By the pressure-bonding, the multilayer film 80 and the resin sheet 50 are integrated into a multilayer, and the semiconductor layer 30, the source electrode 42s, and the drain electrode 42d are buried in the resin sheet 50.

The resin sheet 50 is provided with interlayer connections 60a, 60b, and 60c in advance. The interlayer connections may be for example, paste vias. By pressure-bonding the multilayer film 80 onto the resin sheet 50, the paste via 60a is connected to the source electrode 42s, the paste via 60b is connected to the drain electrode 42d, and the paste via 60c is connected to the first metal layer 10.

As a method of pressure-bonding, for example, pressure is applied while heating the targets by roll lamination, vacuum lamination, hot press, and the like. The resin sheet 50 may be, for example, a resin film of which surface is applied with an adhesive material (e.g., epoxy resin, acrylic resin, polyimide resin, etc.), an uncured resin film, and the like. Furthermore, the resin sheet 50 may be a multilayer film including an inorganic thin film having excellent barrier properties between the surface of the resin film and the adhesive material to improve barrier properties. In this embodiment, a polyimide resin film with a thickness of 12.5 μm, which has a surface to which adhesive epoxy resin is applied, is prepared as the resin sheet 50. The polyimide resin film is bonded onto the upper surface of the inorganic insulating layer 20 to be integrated with the inorganic insulating layer 20.

Moreover, a third metal layer 70 is pressure-bonded onto the surface (the upper surface in FIG. 4(c)) of the resin sheet 50, which is opposite to the surface onto which the multilayer film 80 is pressure-bonded, so that the third metal layer 70 is connected to the interlayer connections 60a, 60b, and 60c in the resin sheet 50. By the pressure-bonding, the third metal layer 70 and the resin sheet 50 are integrated into a multilayer. In this embodiment, for example, copper foil with a thickness of 9 μm is prepared as the third metal layer 70, and bonded onto the upper surface of the resin sheet 50 to be integrated with the resin sheet 50. The pressure-bonding of the third metal layer 70 and the pressure-bonding of the multilayer film 80 may be performed in a same processing step or in different processing steps as necessary.

Figure 4D:
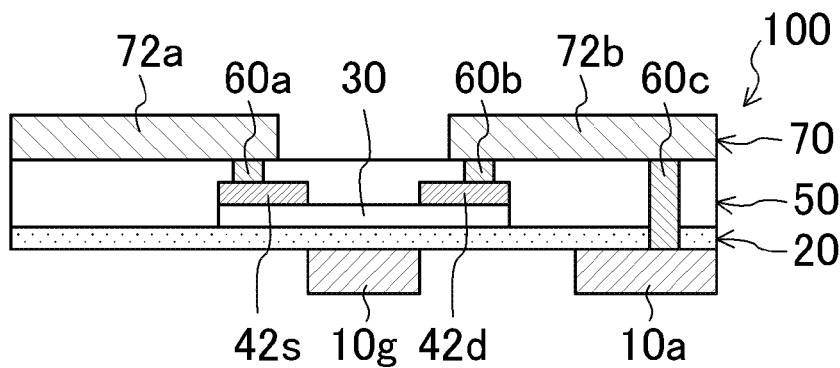

Then, as shown in FIG. 4(d), a gate electrode 10g and an interconnect 10a comprised of the first metal layer 10 are formed by etching the first metal layer 10 of the multilayer film 80. Etchant can be appropriately selected based on the material of the first metal layer 10. For example, ferric chloride can be used for etching the copper foil.

Furthermore, interconnects 72a and 72b comprised of the third metal layer 70 may be formed by etching a part of the third metal layer 70. Etchant can be appropriately selected based on the material of the third metal layer 70. For example, ferric chloride can be used for etching the copper foil. The etching of the third metal layer 70 and the etching of the first metal layer 10 may be performed in a same processing step or in different processing steps as necessary.

As such, the flexible semiconductor device 100 can be formed. According to this embodiment, the multilayer film 80 including the first metal layer 10, the inorganic insulating layer 20, the semiconductor layer 30, and the second metal layer 40 is used, thereby easily forming the source electrode 42s and the drain electrode 42d in the resin layer 50, the semiconductor layer (channel) 30, the inorganic insulating layer (gate insulating film) 20, and the gate electrode 10g (hereinafter collectively referred to as a "TFT structure"). This enables manufacture of the high-performance flexible semiconductor device 100 with excellent productivity. More specifically, manufacture of the multilayer film 80 by a high temperature process, and formation of the TFT structure are performed in different processes, thereby improving the total productivity.

Specifically, in the below-described high temperature process (e.g., at process temperature exceeding heatproof temperature of the resin sheet 50), the step of manufacturing the multilayer film 80 and the step of forming the TFT structure in the resin sheet 50 using the multilayer film 80 are separated. Thus, there is no need to introduce a high temperature process into a manufacturing process using the resin sheet 50. Therefore, the manufacturing process using the resin sheet 50 can be simply performed while improving properties of the TFT to correspond to the high temperature process. As a result, the high-performance flexible semiconductor device 100 can be manufactured with excellent productivity.

Furthermore, prior to the pressure-bonding step of the resin sheet 50, each of the plurality of thin-film transistors can be tested and analyzed, and the thin-film transistors classified as good can be selected and bonded onto the resin sheet 50. This prevents defects, which can occur in final products, in advance during the manufacture, and reduces waste of materials etc. in an assembly and testing process. Also, since the resin sheet 50 is formed on the semiconductor layer 30 after testing and analysis, the resin sheet 50 reduces as a protective layer of the good products, defects and degradation of semiconductor properties in the assembly and testing process, thereby improving reliability of the device.

Moreover, since the source electrode 42s and the drain electrode 42d need to be subjected to fine processing, it is difficult to increase the thickness of the second metal layer 40. However, the thickness and the material can be selected as appropriate by providing the third metal layer 70 as an interconnect. This reduces interconnection resistance of the interconnects 72a and 72b connected to the source electrode 42s and the drain electrode 42d, respectively. Therefore, voltage drops at the interconnects can be reduced even in a circuit requiring a large current.

The resin layer 50 is a base member supporting the TFT structure, and is preferably made of a resin material which is thin and can be warped after curing. As representative examples of the resin material are, for example, epoxy resin, polyimide (PI) resin, acrylic resin, polyethylene terephthalate (PET) resin, polyethylene naphthalate (PEN) resin, polyphenylene sulfide (PPS) resin, polyphenylene ether (PPE) resin, poly-para-xylylene (PPX) resin, and a compound thereof. These resin materials have excellent dimensional stability and are preferable as the material of the flexible base member in the flexible semiconductor device 100 of this embodiment.

Furthermore, various materials can be used for the semiconductor layer 30. The semiconductor layer 30 may be made of, for example, semiconductor such as silicon (Si) and germanium (Ge), and may be oxide semiconductor. As oxide semiconductor, for example, single oxide such as zinc oxide (ZnO), tin dioxide ($SnO_2$), indium oxide ($In_2O_3$), titanium dioxide ($TiO_2$) and composite oxide such as InGaZnO, InSnO, InZnO, and ZnMgO may be used. As an alternative, compound semiconductor (e.g., GaN, SiC, ZnSe, CdS, GaAs, etc.) and organic semiconductor (e.g., pentacene, poly(3-hexylthiophene), porphyrin derivative, copper phthalocyanine, C60, etc.) may be used as necessary.

The first metal layer 10 forming the gate electrode 10g, the second metal layer 40 forming the source electrode 42s and the drain electrode 42d, and the third metal layer 70 forming the interconnects 72a and 72b are preferably made of metal materials having excellent conductivity, for example, copper (Cu), nickel (Ni), aluminum (Al), stainless steel (SUS), gold (Au), and silver (Ag).

Furthermore, the inorganic insulating layer 20 is preferably made of an inorganic compound having a relatively high dielectric constant. The dielectric constant is preferably 8 or more, and more preferably 25 or more. Representative examples of the inorganic compound having such a dielectric constant are metal oxide such as tantalum oxide ($Ta_2O_5$ etc.), aluminum oxide ($Al_2O_3$ etc.), silicon dioxide ($SiO_2$ etc.), zirconium dioxide ($ZrO_2$ etc.), titanium dioxide ($TiO_2$ etc.), yttrium oxide ($Y_2O_3$ etc.), lanthanum oxide ($La_2O_3$ etc.), hafnium dioxide ($HfO_2$ etc.), and nitride of these metals. The inorganic compound may be a dielectric such as barium titanate ($BaTiO_3$), strontium titanate ($SrTiO_3$), and calcium titanate ($CaTiO_3$).

Moreover, the interlayer connections 60a, 60b, and 60c are for example, conductive paste (paste vias) filled in openings communicating the upper surface with the lower surface of the resin layer 50. A representative example for the conductive paste is for example, the mixture of Ag plated copper powder and a resin composition containing epoxy resin as a main component.

Figure 5A:
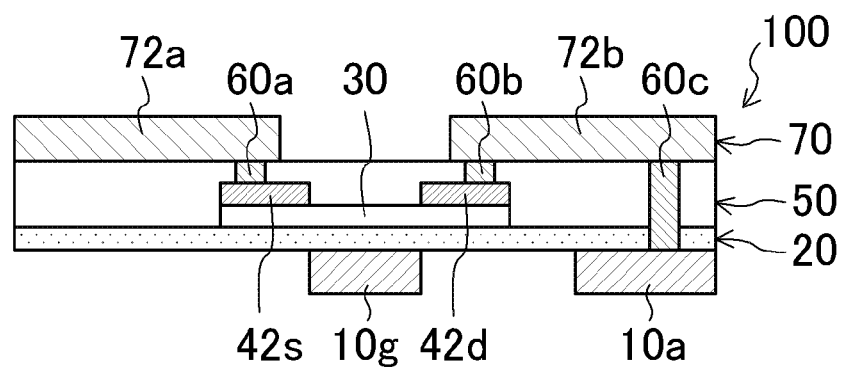
FIG. 5(a) is a cross-sectional view taken along the line A-A of FIG. 5(b).
Figure 5B:
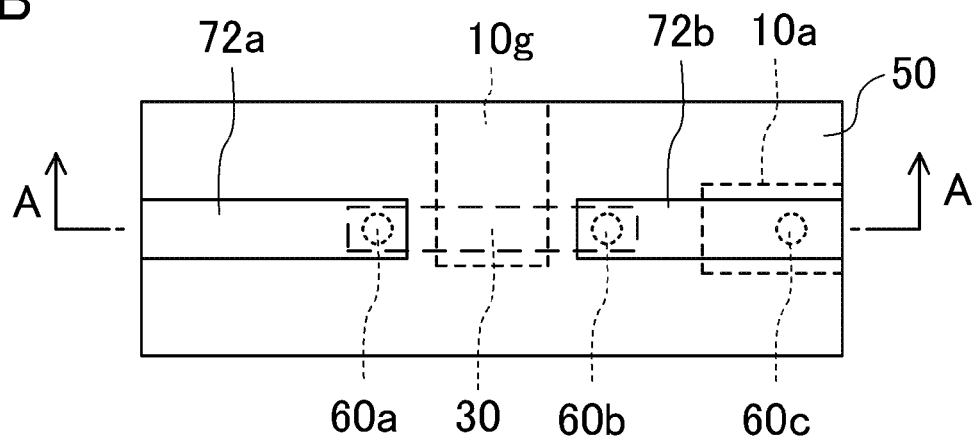
FIG. 5(b) is a top view.

FIGS. 5(a) and 5(b) illustrate the structure of the flexible semiconductor device manufactured by the method in this embodiment. FIG. 5(a) is a cross-sectional view taken along the line A-A of FIG. 5(b). FIG. 5(b) is a top view.

As shown in FIGS. 5(a) and 5(b), the source electrode 42s, the drain electrode 42d, and the semiconductor layer 30 are buried in the resin sheet 50. The inorganic insulating layer (gate insulating film) 20, the gate electrode 10g, and the interconnect 10a are formed on the lower surface of the resin sheet 50. The interconnects 72a and 72b are formed on the upper surface of the resin sheet 50. The source electrode 42s and the drain electrode 42d are connected to the interconnects 72a and 72b through the paste vias 60a and 60b formed in the resin sheet 50. The interconnect 72b is connected to the interconnect 10a through the paste via 60c formed in the resin sheet 50.

Next, formation method of the multilayer film 80 in this embodiment will be described with reference to FIGS. 6(a)-6(d).

Figure 6A:
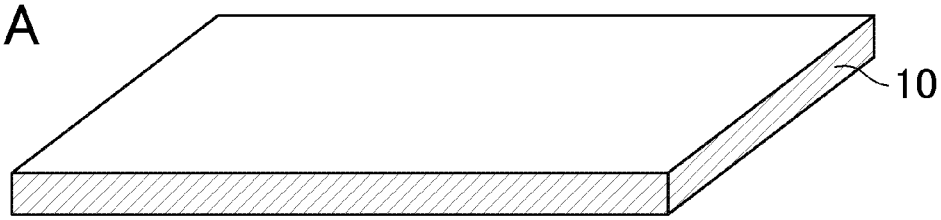
FIGS. 6(a)-6(d) are perspective views illustrating a formation method of a multilayer film in the first embodiment.

First, as shown in FIG. 6(a), the first metal layer 10 is prepared. The first metal layer 10 is for example, metal foil. The first metal layer 10 is not limited to the single piece of the metal foil, and may be a carrier film (e.g., a resin film of polyethylene terephthalate (PET) etc.) on which a metal film is deposited by a thin-film formation method such as sputtering. In this embodiment, copper foil is prepared as the first metal layer 10.

Figure 6B:
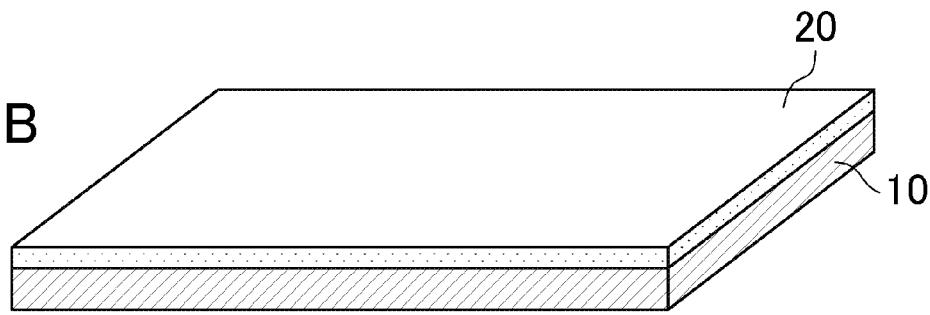

Then, as shown in FIG. 6(b), the inorganic insulating layer 20 is formed on the first metal layer 10. The inorganic insulating layer 20 can be formed in a high temperature process including a processing step at process temperature exceeding the heatproof temperature of the resin sheet 50. The inorganic insulating layer 20 can be formed by a sol-gel method, chemical synthesis, and the like.

Specifically, dispersed solution, in which nanoparticles of barium titanate ($BaTiO_3$) are dispersed, are applied to and dried on the first metal layer 10, and pre-baking and baking are performed in a nitrogen atmosphere (at for example, bake temperature ranging from 600° C. to 800° C.) to form the inorganic insulating layer 20 made of barium titanate. The application method of the dispersed solution is not limited and may be for example, spin coating, roll coating, curtain coating, spraying, liquid droplet ejecting, and the like. The inorganic insulating layer 20 manufactured through such baking treatment (a high temperature process) has a higher dielectric constant than a polymer film, and is thus, particularly preferable as the material of the inorganic insulating layer 20 forming the gate insulating film.

As another formation method of the inorganic insulating layer 20, a conventional formation method of a thin film may be used. Representative examples are vacuum deposition, laser ablation, sputtering, CVD (e.g., plasma CVD), and the like. In laser ablation, the film can be formed with a reduced change in the composition of an inorganic compound. CVD facilitates formation of the inorganic insulating layer 20 to enable synthesis of a multicomponent film, and thus preferable in terms of forming a high-dielectric constant film.

Also, the inorganic insulating layer 20 may be a metal oxide film containing the metal forming the first metal layer 10. In this case, the inorganic insulating layer 20 can be formed by oxidizing the upper surface of the first metal layer 10. The first metal layer 10 is oxidized by for example, anode oxidation, thermal oxidation (surface oxidation by heating), and chemical oxidation (surface oxidation with an oxidizing agent). Note that, when the inorganic insulating layer 20 is the metal oxide film of the first metal layer 10, the metal forming the first metal layer 10 may be oxidized by the above-described oxidation. Although it is not limited, the metal is preferably valve metal (e.g., aluminum, tantalum, etc.). In the case of valve metal, anode oxidation is applicable. An oxide layer can be easily formed on the metal surface and the thickness of the inorganic insulating layer 20 can be controlled to be small (e.g., 1 µm or less, and preferably 0.6 µm or less).

Figure 6C:
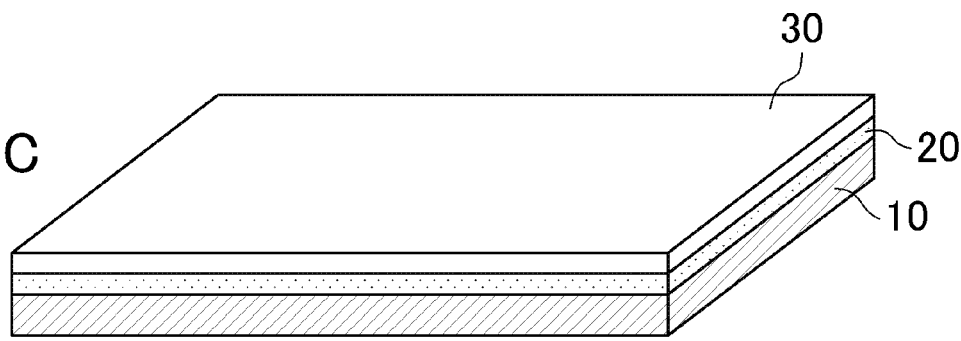

Next, as shown in FIG. 6(c), the semiconductor layer 30 is formed on the inorganic insulating layer 20. The semiconductor layer 30 is formed by for example, depositing a semiconductor material on the upper surface of the inorganic insulating layer 20. The semiconductor material is deposited by for example, a thin-film formation process such as vacuum deposition, sputtering, and plasma CVD, and a printing process such as ink jet printing.

The semiconductor layer 30 can be formed in a high temperature process including a step at process temperature exceeding the heatproof temperature of the resin sheet 50. More specifically, it is preferable that after depositing the semiconductor material on the inorganic insulating layer 20, the deposited semiconductor material is subjected to heat treatment. The heating method of the semiconductor material is not limited, and may be for example, thermal annealing (atmosphere heating), laser annealing, or treatment using both of them. As such, the heat treatment (high temperature process) is performed, thereby proceeding crystallization of the semiconductor, and as a result, semiconductor properties (typically, carrier mobility) can be improved.

Specifically, after obtaining a high order silane compound by irradiating cyclopentasilane-containing solution with UV, the solution containing the high order silane compound is applied to the upper surface of the inorganic insulating layer 20. Then, the heat treatment is performed at a temperature ranging from 300° C. to 600° C. to form the semiconductor layer 30 made of amorphous silicon. A polysilicon film with high carrier mobility is formed by laser annealing. The application method of the solution is not limited, and can be for example, spin coating, roll coating, curtain coating, spraying, liquid droplet ejecting and the like.

When the semiconductor layer 30 is made of oxide semiconductor, a mixture of organic metal is for example, deposited on the inorganic insulating layer 20, and is subjected to heat treatment (e.g., at a temperature of 600° C. or more) to sinter metal, thereby forming oxide semiconductor with high carrier mobility.

Figure 6D:
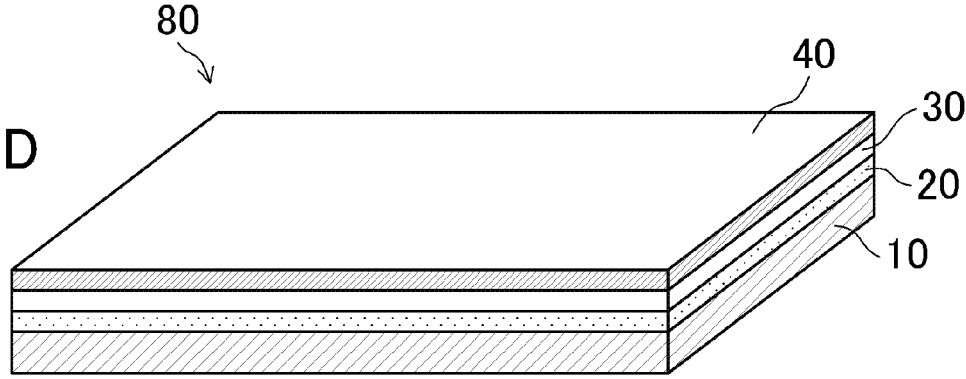

Then, as shown in FIG. 6(d), the second metal layer 40 is formed on the semiconductor layer 30. The second metal layer 40 can be formed by, for example, depositing metal on the upper surface of the semiconductor layer 30. The second metal layer 40 is preferably deposited by for example, vacuum deposition and sputtering.

By the above-described method, the multilayer film 80, in which the first metal layer 10, the inorganic insulating layer 20, the semiconductor layer 30, and the second metal layer 40 are sequentially stacked, can be obtained. According to the manufacturing method of this embodiment, the multilayer film 80 can be prepared at process temperature exceeding the heatproof temperature of the resin sheet 50. Therefore, with the use of the multilayer film 80, a flexible semiconductor device including a high-performance thin-film transistor realized in a high temperature process can be obtained.

The above-described layers 10, 20, 30, and 40 may be formed in the reverse order. That is, the second metal layer 40 may be formed first, the semiconductor layer 30 may be formed thereon, the inorganic insulating layer 20 may be formed thereon, and the first metal layer 10 may be formed thereon.

Second Embodiment

FIGS. 7(a)-7(d) are cross-sectional views illustrating steps in a manufacturing method of a flexible semiconductor device 110 in a second embodiment of the present invention. This embodiment differs from the first embodiment in that the inorganic insulating layer 20 is provided only under the semiconductor layer 30, the source electrode 42s, and the drain electrode 42d. In the following description, repetitive explanation of the first embodiment is omitted.

Figure 7A:
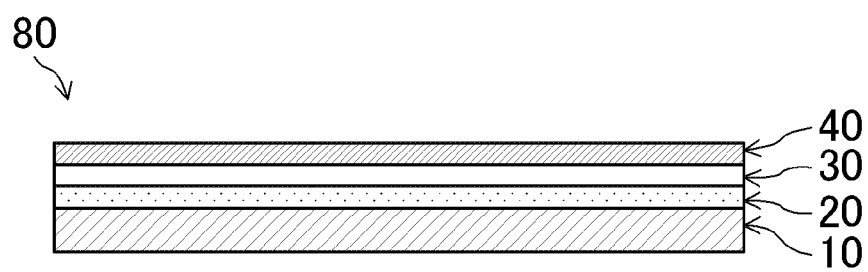
FIGS. 7(a)-7(d) are cross-sectional views illustrating steps in a manufacturing method of a flexible semiconductor device in a second embodiment of the present invention.

First, as shown in FIG. 7(a), the multilayer film 80 formed by sequentially stacking the first metal layer 10, the inorganic insulating layer 20, the semiconductor layer 30, and the second metal layer 40 is prepared.

Figure 7B:
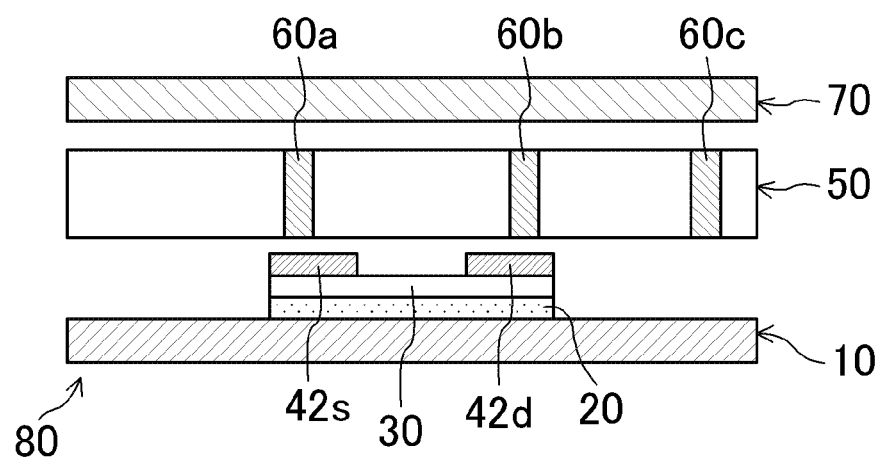

Then, as shown in FIG. 7(b), the source electrode 42s and the drain electrode 42d comprised of the second metal layer 40 is formed by etching the second metal layer 40 in the multilayer film 80. After that, the semiconductor layer 30 and the inorganic insulating layer 20 are removed by etching while retaining the formation region of a thin-film transistor (a region including at least a channel and a gate insulating film).

As such, as shown in FIG. 7(b), the inorganic insulating layer 20 on the first metal layer 10 is formed only under the semiconductor layer 30, the source electrode 42s, and the drain electrode 42d to expose the surface (the upper surface in the figure) of the first metal layer 10 to be pressure-bonded onto the resin sheet 50. The inorganic insulating layer 20 can be removed by for example, etching, laser irradiation, and the like.

Figure 7C:
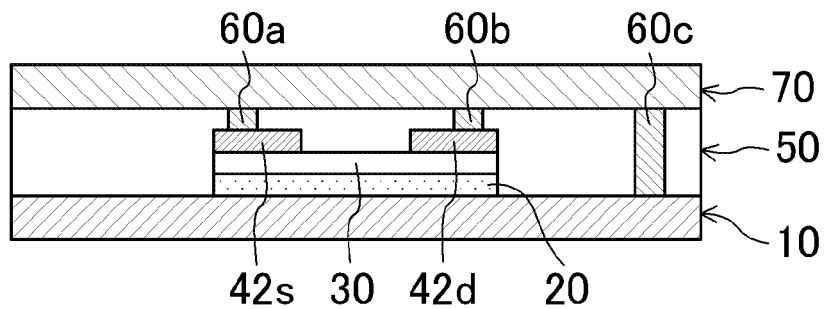

Then, as shown in FIG. 7(c), the resin layer 50 is formed to cover the surface of the multilayer film 80 provided with the source electrode 42s and the drain electrode 42d. Specifically, the multilayer film 80 including the semiconductor layer 30, the source electrode 42s, and the drain electrode 42d is pressure-bonded onto the resin sheet 50 so that the multilayer film 80 and the resin sheet 50 are integrated into a multilayer, and so that the semiconductor layer 30, the source electrode 42, and the drain electrode 42d are buried in the resin sheet 50. The resin sheet 50 is provided in advance with paste vias (interlayer connections) 60a, 60b, and 60c. By pressure-bonding the multilayer film 80 onto the resin sheet 50; the paste via 60a is connected to the source electrode 42s, the paste via 60b is connected to the drain electrode 42d, and the paste via 60c is connected to the first metal layer 10.

Moreover, the third metal layer 70 is pressure-bonded onto the surface (the upper surface in FIG. 7(b)) of the resin sheet 50, which is opposite to the surface onto which the multilayer film 80 is pressure-bonded so that the third metal layer 70 is connected to the interlayer connections 60a, 60b, and 60c in the resin sheet 50. By the pressure-bonding, the third metal layer 70 and the resin sheet 50 are integrated into a multilayer.

Figure 7D:
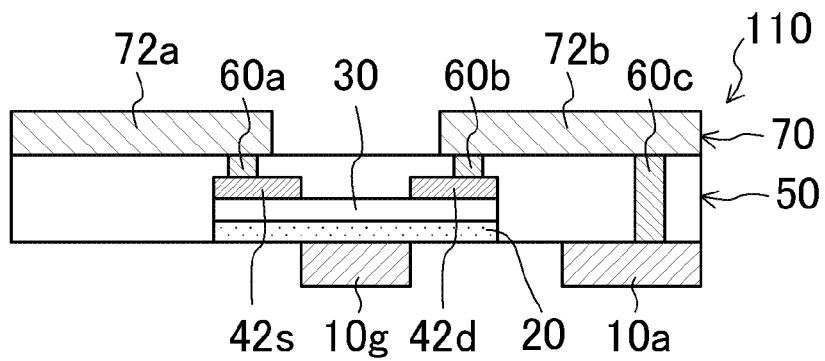

Next, as shown in FIG. 7(d), the gate electrode 10g and the interconnect 10a comprised of the first metal layer 10 are formed by etching the first metal layer 10 of the multilayer film 80.

Also, the interconnects 72a and 72b comprised of the third metal layer 70 are formed by etching a part of the third metal layer 70. As such, the flexible semiconductor device 110 can be formed. As described above, since the inorganic insulating layer 20 is formed only in a needed area (the formation region of the thin-film transistor), high accuracy alignment in the formation of the paste via 60c connecting the third metal layer 70 to the first metal layer 10 is not necessary, thereby improving reliability and flexibility of the flexible semiconductor device.

Third Embodiment

FIGS. 8(a)-8(e) are cross-sectional views illustrating steps in a manufacturing method of a flexible semiconductor device 120 in a third embodiment of the present invention. This embodiment differs from the first embodiment in that the interlayer connections 60a and 60b connected to the source electrode 42s and the drain electrode 42d, and the interlayer connection 60c connected to the first metal layer 10 are not the paste vias but plated vias. In the following description, repetitive explanation of the first embodiment is omitted.

Figure 8A:
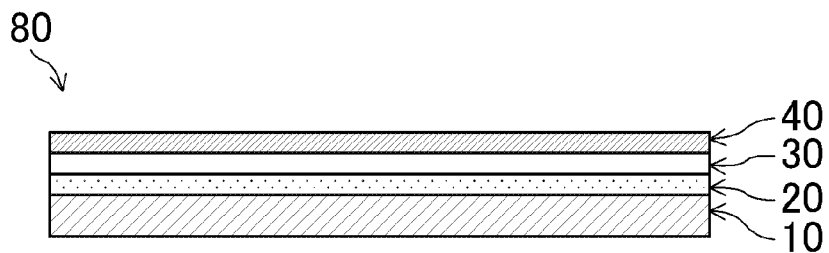
FIGS. 8(a)-8(e) are cross-sectional views illustrating steps in a manufacturing method of a flexible semiconductor device in a third embodiment of the present invention.

First, as shown in FIG. 8(a), the multilayer film 80 formed by sequentially stacking the first metal layer 10, the inorganic insulating layer 20, the semiconductor layer 30, and the second metal layer 40 is prepared.

Figure 8B:
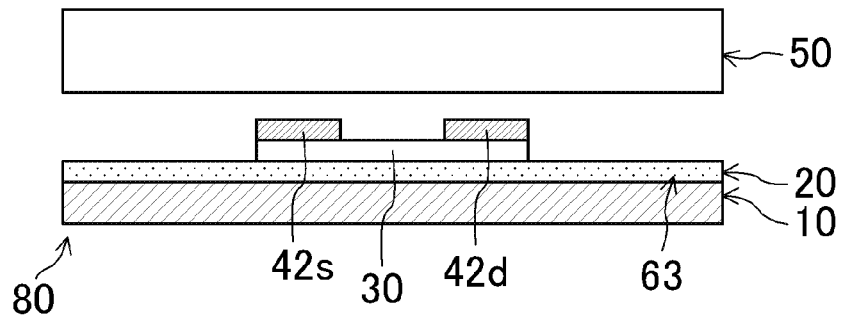

Then, as shown in FIG. 8(b), the source electrode 42s and the drain electrode 42d comprised of the second metal layer 40 is formed by etching the second metal layer 40. Furthermore, the semiconductor layer 30 is removed by etching while retaining the formation region of a thin-film transistor.

Figure 8C:
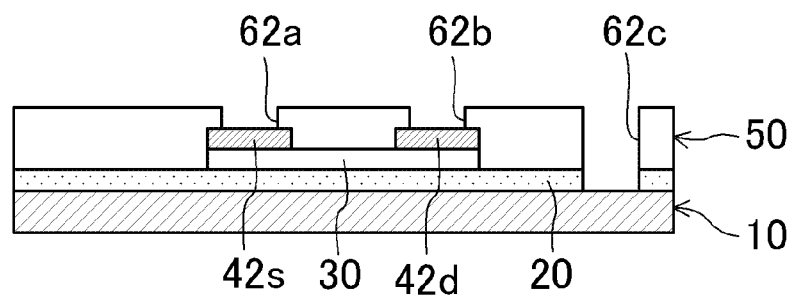

Next, as shown in FIG. 8(c), the resin layer 50 is formed to cover the surface of the multilayer film 80 provided with the semiconductor layer 30, the source electrode 42s, and the drain electrode 42d. Specifically, the multilayer film 80 including the semiconductor layer 30, the source electrode 42s, and the drain electrode 42d is pressure-bonded onto the resin sheet 50 to burry the semiconductor layer 30, the source electrode 42s, and the drain electrode 42d in the resin sheet 50. Note that the resin layer 50 is formed not only by pressure-bonding the resin sheet 50, but may be formed by for example, applying a resin material onto the multilayer film 80 (e.g., by spin coating, roll coating, etc.).

After that, an opening 62a exposing a part of the source electrode 42s, an opening 62b exposing a part of the drain electrode 42d, and an opening 62c exposing a part of the upper surface of the first metal layer 10 are formed on the surface (the upper surface in FIG. 8(c)) of the resin sheet 50, which is opposite to the surface onto which the multilayer film 80 is pressure-bonded. The opening 62a, 62b, and 62c are formed for example, by laser irradiation.

Figure 8D:
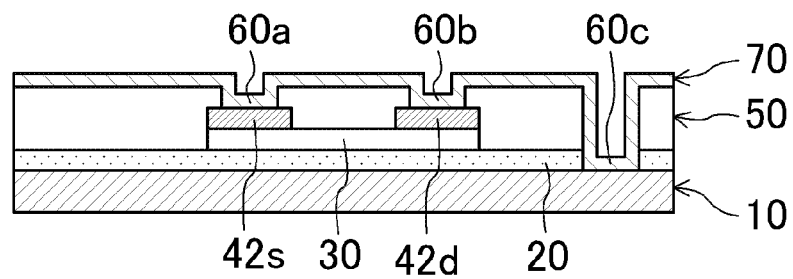

Then, as shown in FIG. 8(d), a plated layer 70 is formed on the surface of the resin sheet 50 which is opposite to the surface onto which the multilayer film 80 is pressure-bonded so that the plated layer 70 is in contact with the source electrode 42s, the drain electrode 42d, and the first metal layer 10 with the openings 62a, 62b, and 62c interposed therebetween. Specifically, the plated layer 70 is deposited to cover wall surfaces of the openings 62a, 62b, and 62c, the source electrode 42s, the drain electrode 42d, and the upper surface of the first metal layer 10, thereby forming the plated vias (interlayer connections) 60a, 60b, and 60c. Also, the plated layer 70 is deposited to cover the upper surface of the resin sheet 50, thereby forming a third metal layer 70. The plated layer 70 may be formed by for example, electro or electroless copper plating by an additive process. In this embodiment, an electroless copper plated layer is stacked on the upper surface of the resin sheet 50 and is then subjected to electro copper plating to increase the thickness of the copper plated layer, thereby forming the plated layer 70 with a thickness of about 2 μm.

Figure 8E:
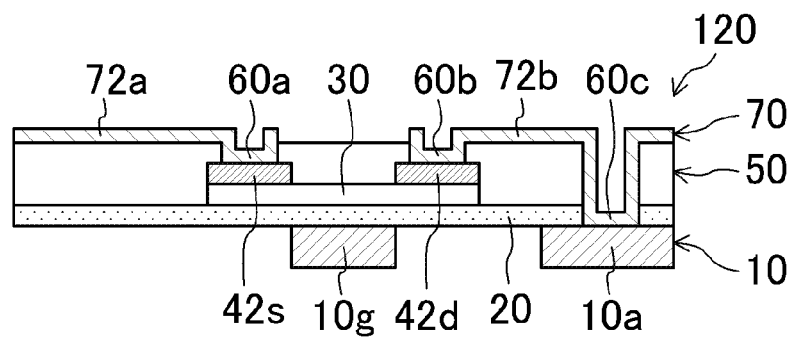

After that, as shown in FIG. 8(e) the gate electrode 10g and the interconnect 10a are formed by etching a part of the first metal layer 10. Also, the interconnect 72a connected to the source electrode 42s through the plated via 60a, and the interconnect 72b connected to the drain electrode 42d and the interconnect 10a through the plated vias 60b and 60c are formed by etching a part of the plated layer (third metal layer) 70. The interconnects 72a and 72b may be formed by slice etching with resist.

As such, the flexible semiconductor device 120 provided with the plated vias as interlayer connections can be formed. According to this embodiment, the source electrode 42s, the drain electrode 42d, and the first metal layer 10 are easily connected to the plated via 60a, the plated via 60b, and the plated via 60c. Specifically, when the interlayer connections are the paste vias (in the first embodiment), high accurate alignment is needed in pressure-bonding the multilayer film 80 onto the resin sheet 50 so that the paste via 60a is in contact with the source electrode 42s, the paste via 60b is in contact with the drain electrode 42d, and the paste via 60c is in contact with the first metal layer 10 with the opening 62c of the inorganic insulating layer 20 interposed therebetween. However, when the interlayer connections are the plated vias, high accuracy alignment is not necessary in pressure-bonding the multilayer film 80 onto the resin sheet 50, thereby easily and stably manufacturing the flexible semiconductor device 120.

Note that, while in the first embodiment and this embodiment, examples have been described where the interlayer connections 60a, 60b, and 60c are the paste vias or the plated vias, both of them may be mixed in a single flexible semiconductor device.

Fourth Embodiment

FIGS. 9(a)-9(d) are cross-sectional views illustrating steps in a manufacturing method of a flexible semiconductor device 130 in a fourth embodiment of the present invention. This embodiment differs from the first embodiment in that a multilayer film 81 further includes a diffusion barrier layer 90 between the semiconductor layer 30 and the second metal layer 40. Note that, in the following description, repetitive explanation of the first embodiment is omitted.

In general, copper (Cu) has the tendency of being diffused in a semiconductor material (e.g., silicon) at a high temperature of hundreds of degrees (° C.). Thus, the source electrode 42s and the drain electrode 42d (the second metal layer 40) are made of copper, and are subjected to high temperature in a manufacturing process, copper atoms constituting the second metal layer 40 moves into the semiconductor layer 30, thereby causing problems such as junction leakage of the device and fluctuations in the threshold voltage.

Thus, one of the features of this embodiment is that the multilayer film 81 including the diffusion barrier layer 90 between the semiconductor layer 30 and the second metal layer 40 in advance is prepared, and a thin-film transistor is formed by using the multilayer film 81 as a base material. In this structure, by providing the diffusion barrier layer 90 between the source electrode 42s and the semiconductor layer 30, and between the drain electrode 42d and the semiconductor layer 30, the diffusion of the copper atoms into the semiconductor layer 30 can be reduced. As a result, problems such as the junction leakage and the fluctuations in the threshold voltage can be reduced in advance.

As the material of the diffusion barrier layer 90, a conductive inorganic compound having diffusion barrier properties against copper can be used. The inorganic compound may be for example, transition metal such as tantalum (Ta) and titanium (Ti). As an alternative, transition metal nitride such as tantalum nitride (TaN etc.) and titanium nitride (TiN etc.) may be used. Tantalum nitride has excellent adhesiveness to copper formed by sputtering and excellent diffusion barrier properties against copper, and is thus, particularly preferable as the material of the diffusion barrier layer 90.

A manufacturing method of the flexible semiconductor device 130 in this embodiment will be described hereinafter with reference to FIGS. 9(a)-9(d).

Figure 9A:
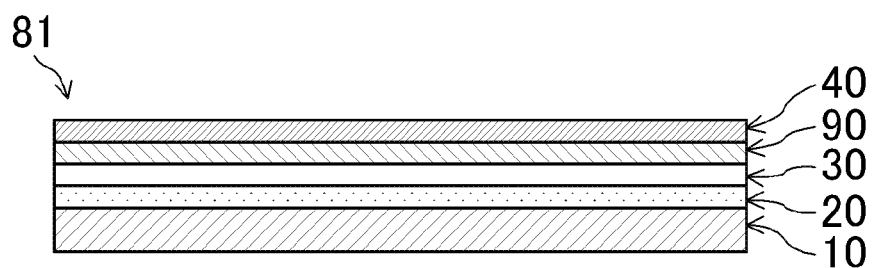
FIGS. 9(a)-9(d) are cross-sectional views illustrating steps in a manufacturing method of a flexible semiconductor device in a fourth embodiment of the present invention.

First, as shown in FIG. 9(a), the multilayer film 81 formed by sequentially stacking the first metal layer 10, the inorganic insulating layer 20, the semiconductor layer 30, the diffusion barrier layer 90, and the second metal layer 40 is prepared. The multilayer film 81 includes the diffusion barrier layer 90 between the semiconductor layer 30 and the second metal layer 40. The diffusion barrier layer 90 can be formed by for example, depositing the material of the diffusion barrier layer 90 on the semiconductor layer 30 by a thin-film formation process such as sputtering and CVD.

Figure 9B:
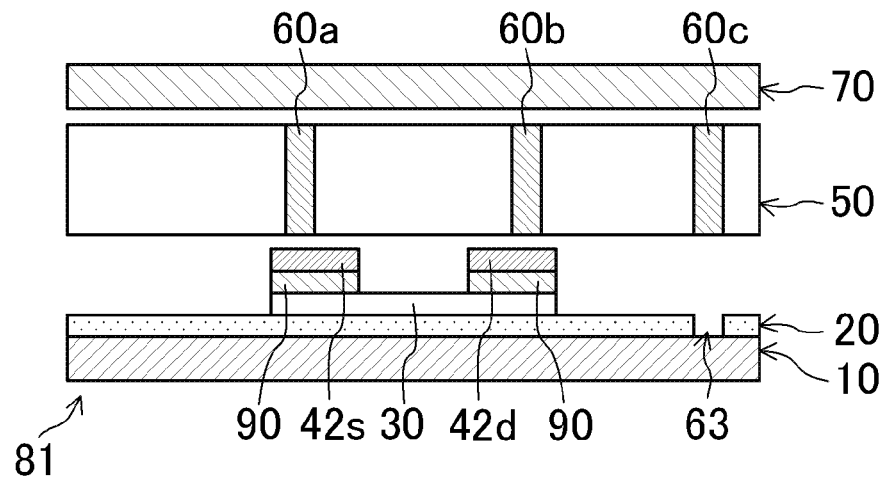

Then, as shown in FIG. 9(b), the second metal layer 40 is etched to form the source electrode 42s and the drain electrode 42d by patterning. After that, the diffusion barrier layer 90 is removed by etching while retaining a region under the source electrode 42s and the drain electrode 42d. The removing method of the diffusion barrier layer 90 is not limited but may be for example, etching (both of dry etching and wet etching may be used) which may be used in conventional photolithography. Then, the semiconductor layer 30 is removed by etching while retaining the formation region of the thin-film transistor.

Figure 9C:
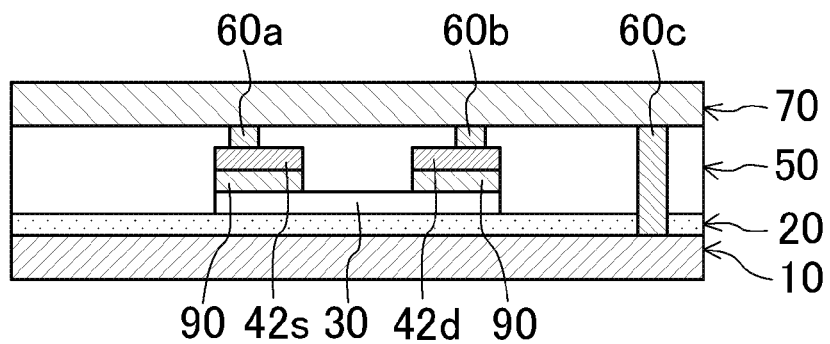

Next, as shown in FIG. 9(c), the multilayer film 81, the resin sheet 50, and the third metal layer 70 are pressure-bonded and integrated. By the pressure-bonding, the semiconductor layer 30, the source electrode 42s, and the drain electrode 42d of the multilayer film 80 are buried in the resin sheet 50.

Figure 9D:
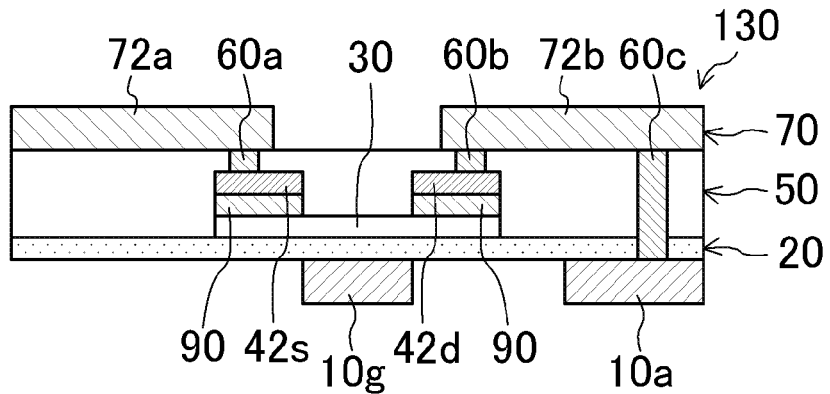

Then, as shown in FIG. 9(d), the gate electrode 10g and the interconnect 10a comprised of the first metal layer 10 are formed by etching the first metal layer 10 of the multilayer film 80. Also, the interconnects 72a and 72b comprised of the third metal layer 70 are formed by etching a part of the third metal layer 70. As such, the flexible semiconductor device 130 including the diffusion barrier layer 90 can be formed.

Fifth Embodiment

Figure 10A:
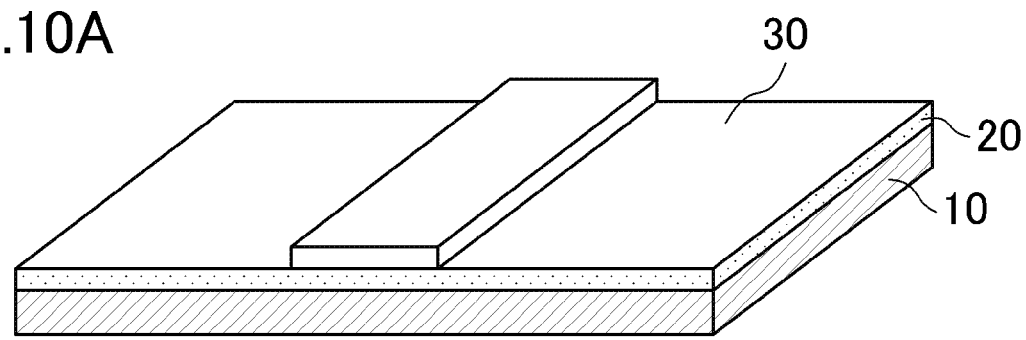
FIGS. 10(a) and 10(b) are perspective views illustrating a formation method of a multilayer film in a fifth embodiment of the present invention.
Figure 10B:
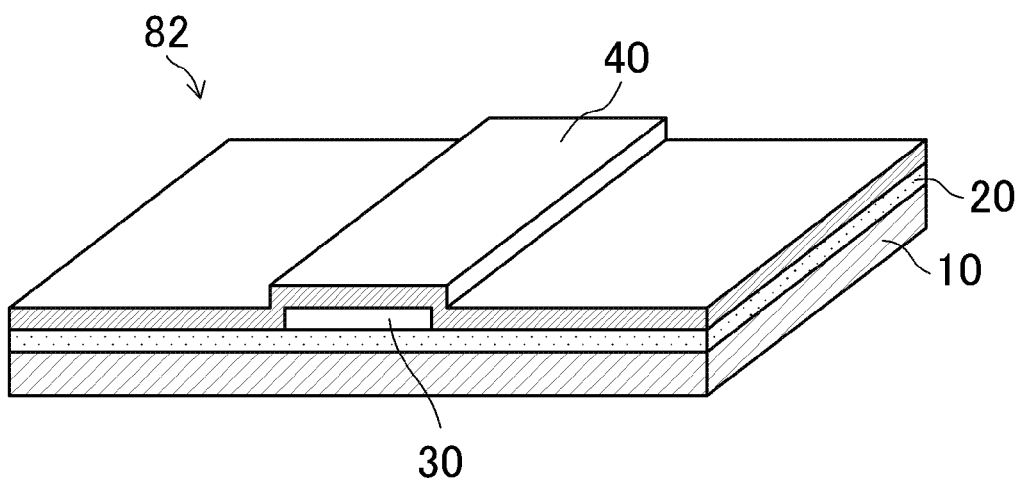

FIGS. 10(a) and 10(b) are perspective views illustrating a manufacturing method of a multilayer film 82 in a fifth embodiment of the present invention. The multilayer film 82 of this embodiment differs from the multilayer film 80 of the first embodiment in that the semiconductor layer 30 is patterned in advance.

The multilayer film 82 is manufactured by stacking the patterned semiconductor layer 30 on the inorganic insulating layer 20 as shown in FIG. 10(a), and then stacking the second metal layer 40 on the patterned semiconductor layer 30 as shown in FIG. 10(b). The semiconductor layer 30 can be patterned by for example, printing such as ink jet printing.

Next, a manufacturing method of a flexible semiconductor device 140 using the multilayer film 82 will be described with reference to FIGS. 11(a)-11(d).

Figure 11A:
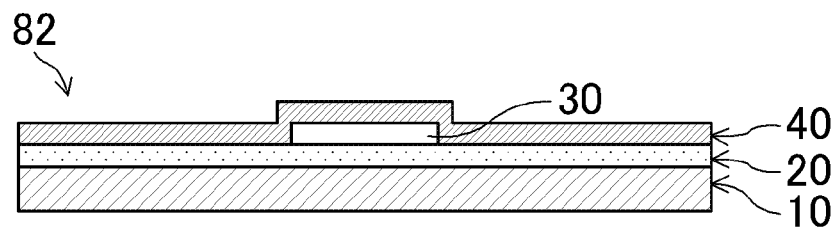
FIGS. 11(a)-11(d) are cross-sectional views illustrating the steps in the manufacturing method of the flexible semiconductor device in the fifth embodiment.
Figure 11B:
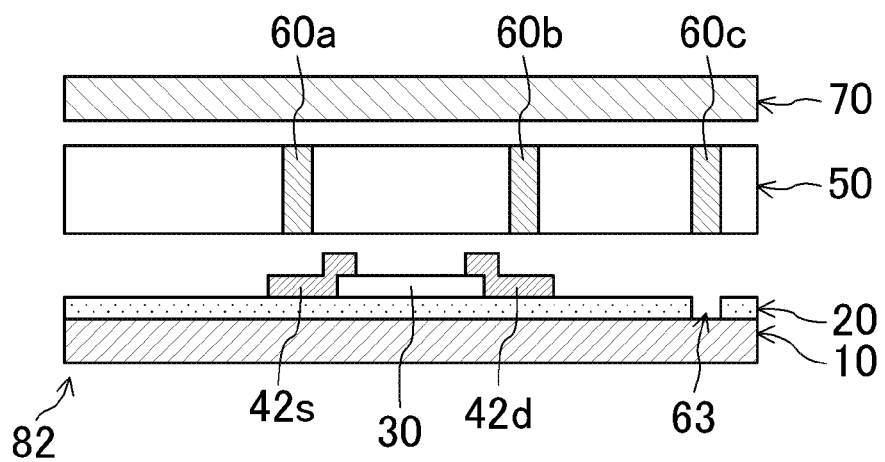

First, as shown in FIG. 11(a), the multilayer film 82 including the patterned semiconductor layer 30 is prepared. Then, as shown in FIG. 11(b), the second metal layer 40 is etched to form the source electrode 42s and the drain electrode 42d. At this time, there is no need to pattern the semiconductor layer 30, since the semiconductor layer 30 has been already patterned.

Figure 11C:
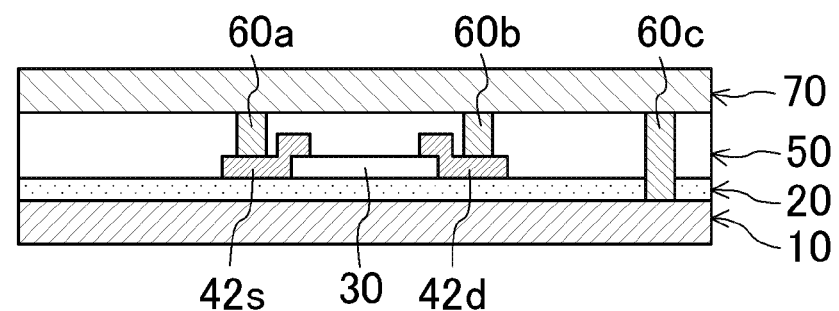
Figure 11D:
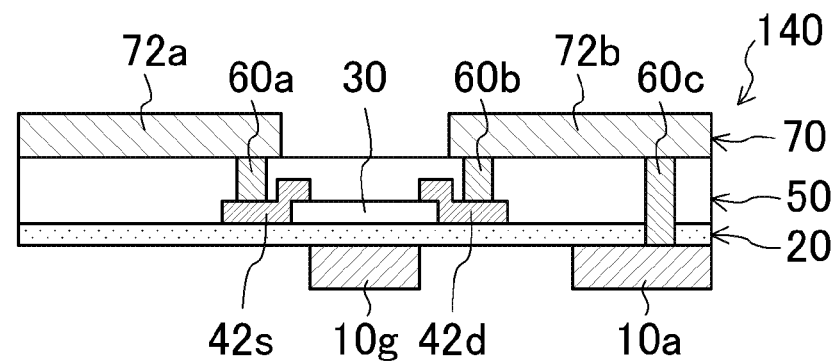

Next, as shown in FIG. 11(c), the multilayer film 82, the resin sheet 50, and the third metal layer 70 are integrated. After that, as shown in FIG. 11(d), the first metal layer 10 and the third metal layer 70 are etched to form the gate electrode 10g, the interconnect 10a, and the interconnects 72a and 72b. As such, the flexible semiconductor device 140 is completed.

In this embodiment, since the multilayer film 82 including the semiconductor layer 30 patterned in advance is used, the patterning step of the semiconductor layer 30 can be omitted, thereby further facilitating the manufacturing process.

Sixth Embodiment

FIGS. 12(a)-12(d) and 13(a)-13(c) are cross-sectional views illustrating steps in a manufacturing method of a flexible semiconductor device 150 in a sixth embodiment of the present invention. This embodiment differs from the fifth embodiment in that the inorganic insulating layer 20 is formed on the lower surfaces of the semiconductor layer 30, the source electrode 42s, and the drain electrode 42d. Furthermore, in this embodiment, the interlayer connections 60a, 60b, and 60c are plated vias manufactured by conformal plating. In the following description, repetitive explanation of the fifth embodiment is omitted.

Figure 12A:
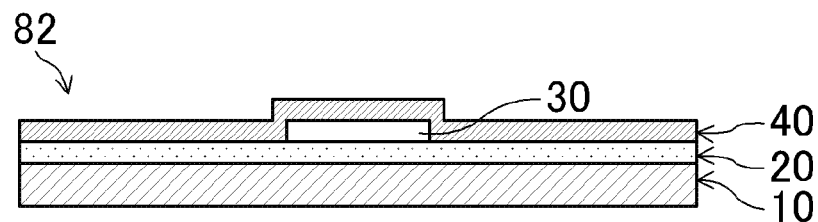
FIGS. 12(a)-12(d) are cross-sectional views illustrating steps in a manufacturing method of a flexible semiconductor device in a sixth embodiment of the present invention.
Figure 12B:
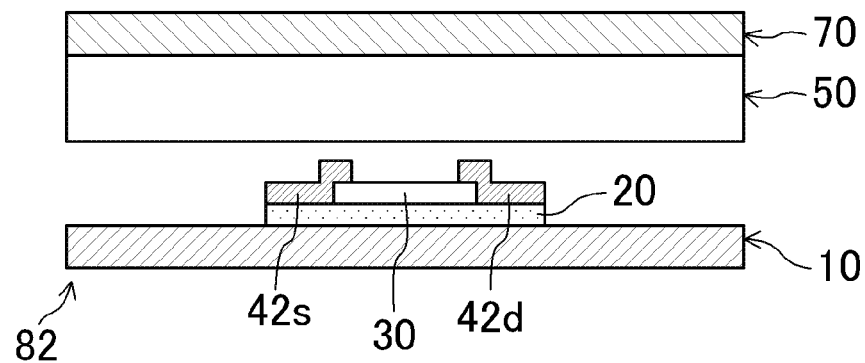

First, as shown in FIG. 12(a), the multilayer film 82 including the semiconductor layer 30 with predetermined patterns is prepared. Then, as shown in FIG. 12(b), after forming the source electrode 42s and the drain electrode 42d by etching the second metal layer 40, the inorganic insulating layer 20 is removed by etching while retaining the formation region of a thin-film transistor.

Figure 12C:
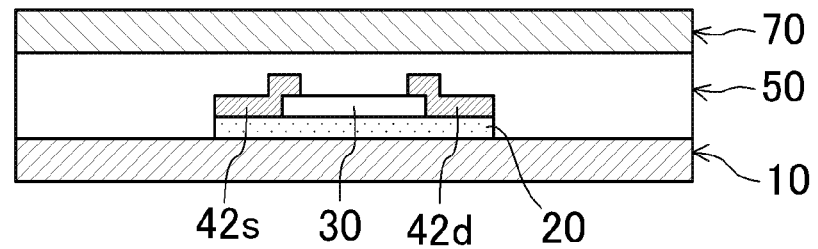
Figure 12D:
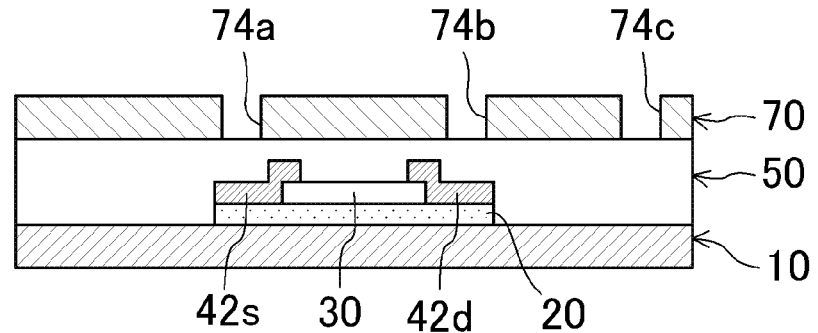

Next, as shown in FIG. 12(c), the resin sheet 50 and the third metal layer 70 integrated in advance are prepared, and the multilayer film 82 is pressure-bonded onto the resin sheet 50. Then, openings 74a, 74b, and 74c are formed by etching a part of the third metal layer 70.

Figure 13A:
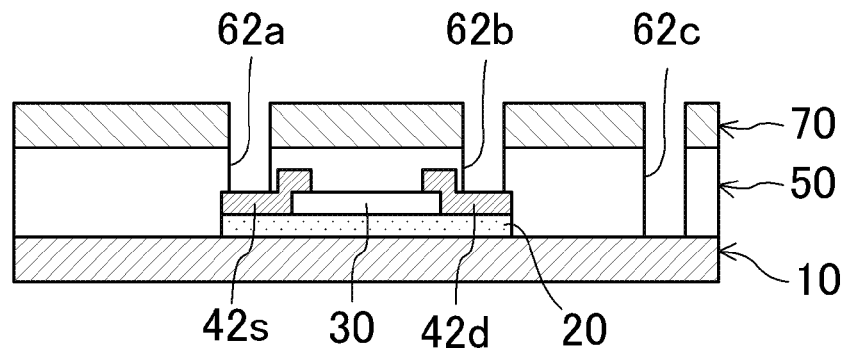
FIGS. 13(a)-13(c) are cross-sectional views illustrating steps in the manufacturing method of the flexible semiconductor device in the sixth embodiment.
Figure 13B:
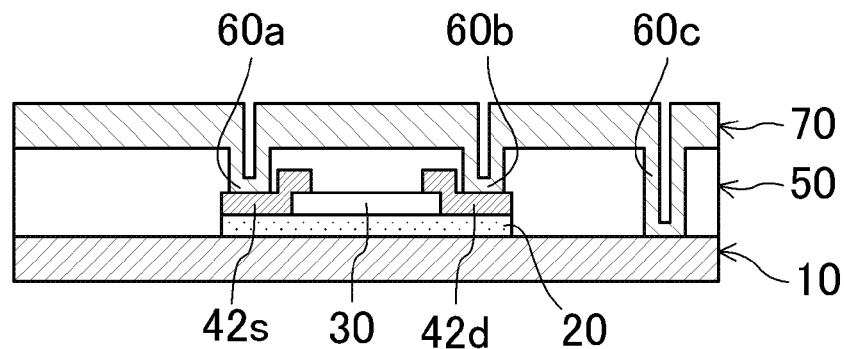

After that, as shown in FIG. 13(a), laser irradiation is performed using the openings 74a, 74b, and 74c as guide walls to form the openings 62a, 62b, and 62c which penetrate the resin sheet 50. Then, as shown in FIG. 13(b), the side surfaces and bottom surfaces of the openings 62a, 62b, and 62c are plated with copper to form plated vias 60a, 60b, and 60c which are in contact with the source electrode 42s, the drain electrode 42d, and the first metal layer 10, respectively.

Figure 13C:
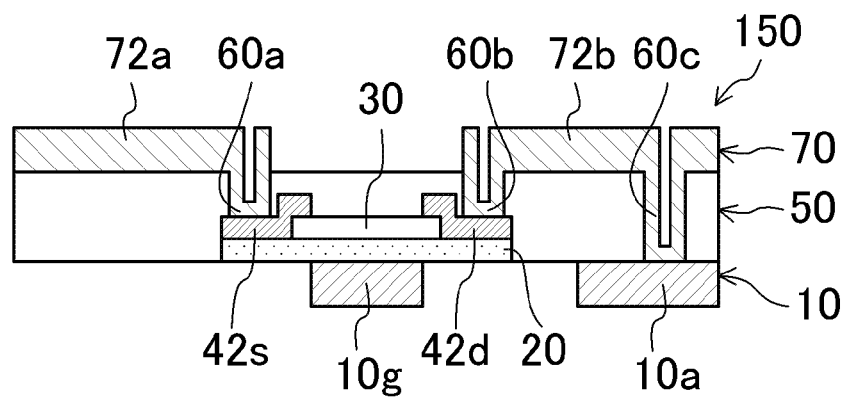

Next, as shown in FIG. 13(c), the gate electrode 10g and the interconnect 10a are formed by etching the first metal layer 10. Also, the interconnects 72a and 72b are formed by etching the third metal layer 70. As such, the flexible semiconductor device 150 is completed.

In this embodiment, since the inorganic insulating layer 20 is formed only in a needed area (the formation region of the thin-film transistor), defects such as cracks occurring in the inorganic insulating layer 20 can be reduced. This realizes the flexible semiconductor device 150 with improved reliability and flexibility.

Seventh Embodiment

FIGS. 14(a)-14(d) are cross-sectional views illustrating steps in a manufacturing method of a flexible semiconductor device 160 in a seventh embodiment of the present invention. A multilayer film 83 of this embodiment has a different structure from the multilayer film 82 shown in the fifth embodiment in that the diffusion barrier layer 90 is formed only on a surface and the side surface of the semiconductor layer 30 patterned in advance. In the following description, repetitive explanation of the fifth embodiment is omitted.

Figure 14A:
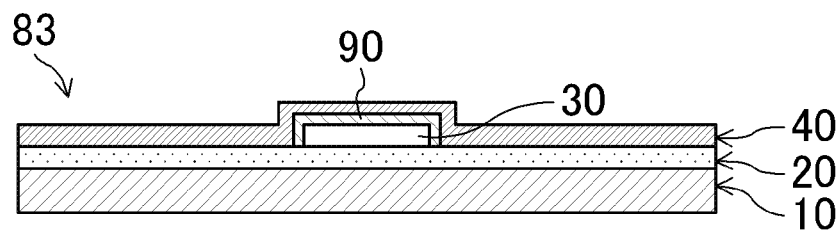
FIGS. 14(a)-14(d) are cross-sectional views illustrating steps in a manufacturing method of a flexible semiconductor device in a seventh embodiment of the present invention.

First, as shown in FIG. 14(a), the multilayer film 83 including the diffusion barrier layer 90 on a surface and the side surface of the semiconductor layer 30 patterned in advance is prepared.

Figure 14B:
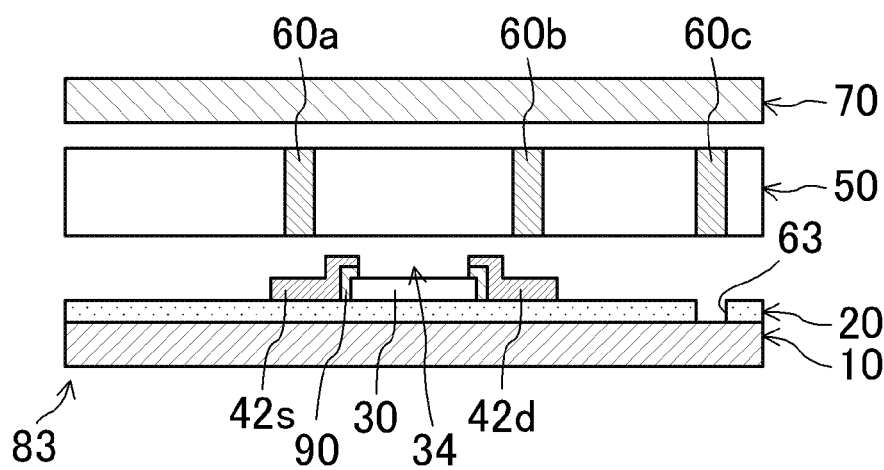

Then, as shown in FIG. 14(b), the source electrode 42s and the drain electrode 42d are formed by etching the second metal layer 40. Furthermore, an opening 34 exposing a part of the diffusion barrier layer 90 is formed. Then, the diffusion barrier layer 90 is patterned by removing the diffusion barrier layer 90 exposed to the opening 34.

Figure 14C:
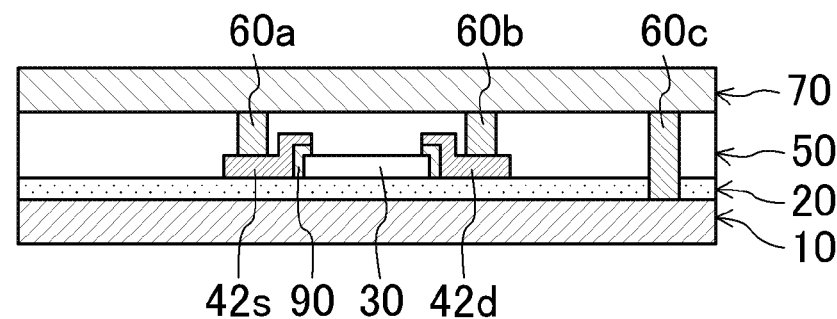
Figure 14D:
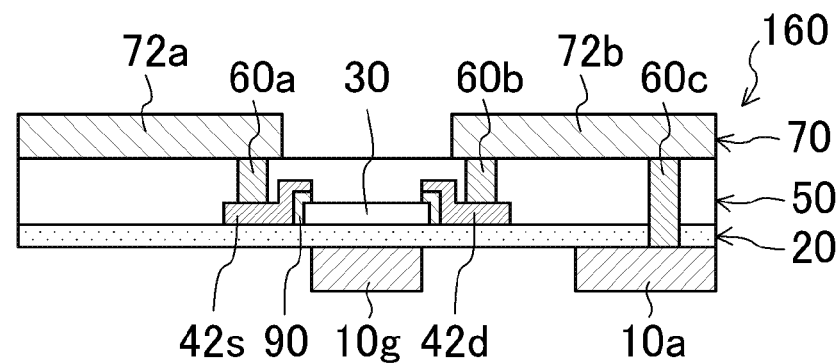

Next, as shown in FIG. 14(c), the multilayer film 83, the resin sheet 50, and the third metal layer 70 are pressure-bonded and integrated. After that, as shown in FIG. 14(d), the gate electrode 10g and the interconnect 10a are formed by etching a part of the first metal layer 10. Also, the interconnects 72a and 72b are formed by etching the third metal layer 70. As such, the flexible semiconductor device 160, in which the diffusion barrier layer 90 is selectively formed between the source electrode 42s and the semiconductor layer 30, and between the drain electrode 42d and the semiconductor layer 30, can be formed.

Eighth Embodiment

FIGS. 15(a)-15(d) are cross-sectional views illustrating steps in a manufacturing method of a flexible semiconductor device 170 in an eighth embodiment of the present invention. This embodiment differs from the fifth embodiment in that a capacitor is formed other than the thin-film transistor using the multilayer film 82. In the following description, repetitive explanation of the fifth embodiment is omitted.

First, as shown in FIG. 15(a), the multilayer film 82 including the patterned semiconductor layer 30 is prepared. Then, as shown in FIG. 15(b), the source electrode 42s and the drain electrode 42d, as well as an upper electrode 96 of the capacitor are formed by etching the second metal layer 40 of the multilayer film 82. Furthermore, a part to be a gate insulating film is formed together with a dielectric layer 94 of the capacitor by partially removing the inorganic insulating layer 20.

Then, as shown in FIG. 15(c), the multilayer film 82, the resin sheet 50, and the third metal layer 70 are pressure-bonded and integrated. At this time, the upper electrode 96 of the capacitor and the interlayer connection 60c are aligned to be in contact with each other so that the upper electrode 96 is connected to the interlayer connection 60c.

Next, as shown in FIG. 15(d), the gate electrode 10g is formed together with a lower electrode 98 of the capacitor by etching the first metal layer 10. Also, the interconnects 72a and 72b are formed by etching the third metal layer 70. As such, the flexible semiconductor device 170 including a capacitor 92 other than the thin-film transistor can be obtained.

Ninth Embodiment

Figure 16A:
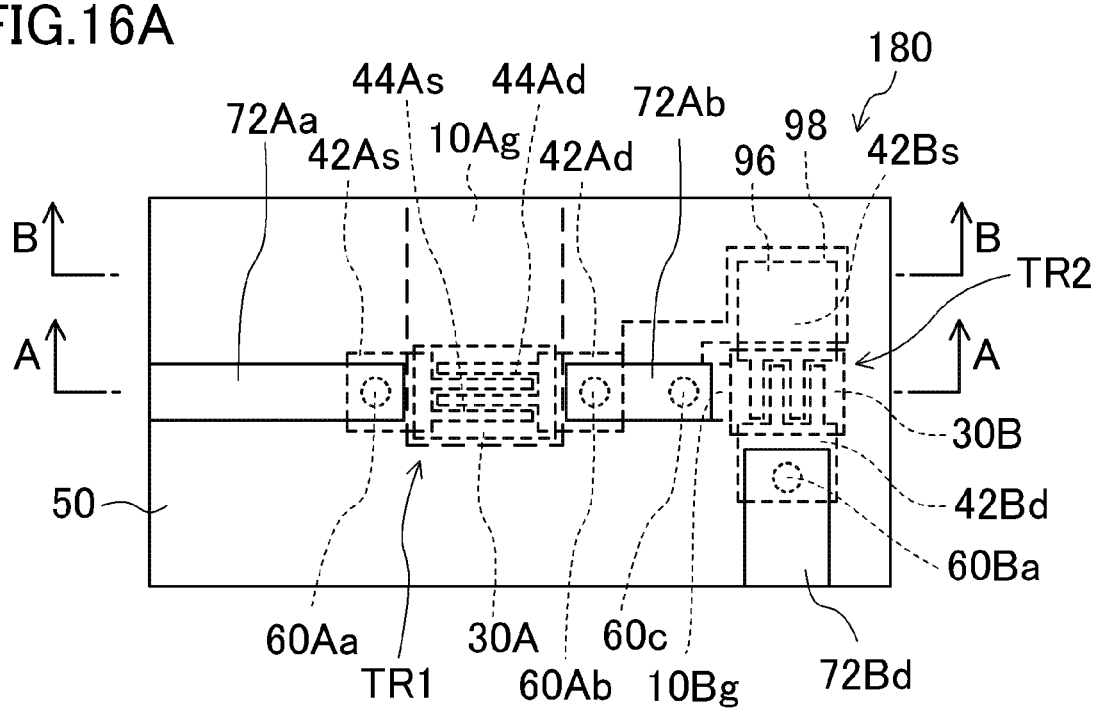
FIG. 16(a) is a top view.
Figure 16B:
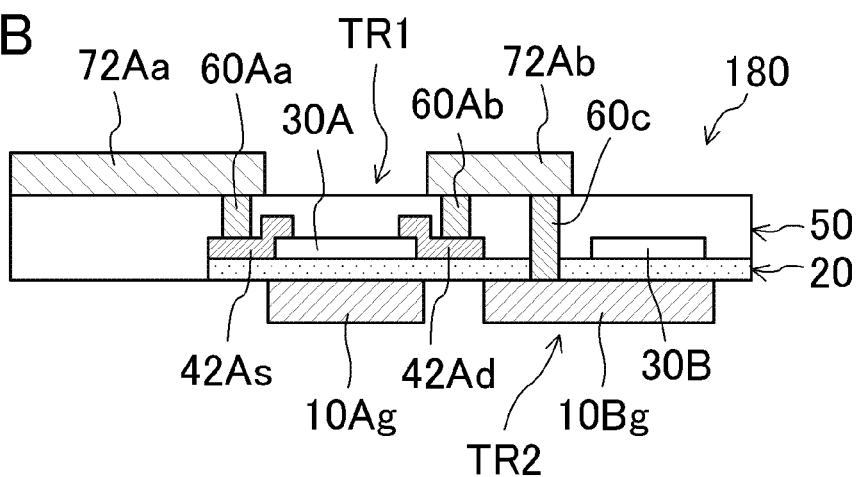
FIG. 16(b) is a cross-sectional view taken along the line A-A of FIG. 16(a).
Figure 16C:
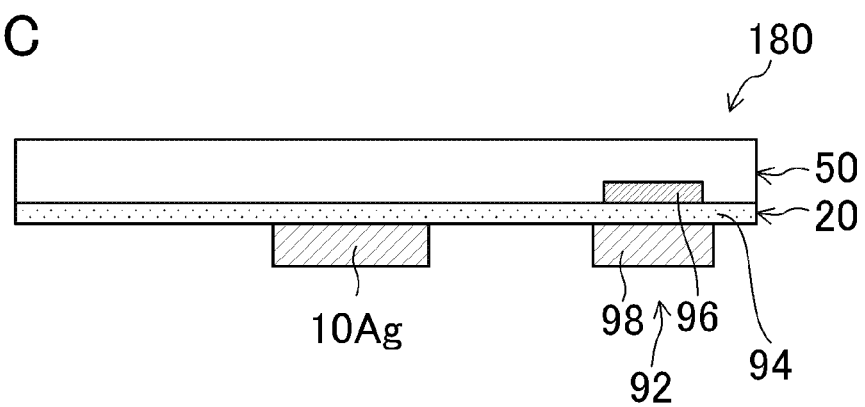
FIG. 16(c) is a cross-sectional view taken along the line B-B of FIG. 16(a).

FIGS. 16 (a)-(d) illustrate the structure of a flexible semiconductor device 180 in a ninth embodiment of the present invention. FIG. 16(a) is a top view. FIG. 16(b) is a cross-sectional view taken along the line A-A of FIG. 16(a). FIG. 16(c) is a cross-sectional view taken along the line B-B of FIG. 16(a).

In this embodiment, an example flexible semiconductor device 180 preferably mounted on an image display device (e.g., organic EL display) will be described.

The flexible semiconductor device 180 mounted on the image display device has at least two thin-film transistors (TFT devices), each of which includes a channel (a semiconductor layer), a gate insulating film (an inorganic insulating layer), a gate electrode (a first metal layer) and source/drain electrodes (a second metal layer). The number of the TFTs for a single pixel is two, and the flexible semiconductor device 180 includes a first TFT device TR1 and the second TFT device TR2. In this embodiment, the first TFT device TR1 is a transistor for switching, and the second TFT device TR2 is a transistor for driving.

As shown in FIG. 16(b), a drain electrode 42Ad of the TFT device TR1 for switching is electrically connected to a gate electrode 10Bg of the TFT device TR2 for driving through an interlayer connection 60Ab, an interconnect 72Ab, and the interlayer connection 60c.

In this embodiment, as shown in FIG. 16(a), a part of a source electrode 42As and a part of the drain electrode 42Ad extend to the upper surface of a semiconductor layer 30A. The extending portion 44As of the source electrode 42As and the extending portion 44Ad of the drain electrode 42Ad are shaped like comb teeth at the opposing portions. This increases effective channel width, thereby obtaining high-speed operation. The length of the comb teeth shapes can be changed as appropriate based on the required TFT performance. For example, the length of the comb teeth shape in the TFT device TR2 for driving may be greater than that in the TFT device TR1 for switching. Note that the flexible semiconductor device 180 can be clearly operated without these extending portions 44As and 44Ad.

As shown in FIG. 16(c), the flexible semiconductor device 180 further includes the capacitor 92. The capacitor 92 holds capacitance to drive the TFT device TR2 for driving. The upper electrode 96, the dielectric layer 94, and the lower electrode 98 constituting the capacitor 92 are comprised of the second metal layer 40, the inorganic insulating layer 20, and the first metal layer 10, respectively. Note that the dielectric layer 94 may not be removed by etching while retaining the formation region of the capacitor 92 as shown in FIG. 15(d).

The lower electrode 98 of the capacitor 92 is connected to the drain electrode 42Ad of the TFT device TR1 for switching, and the gate electrode 10Bg of the TFT device TR2 for driving through the gate electrode 10Bg of the TFT device TR2 for driving, the interlayer connection 60c, the interconnect 72Ab, and the interlayer connection 60Ab. Also, the upper electrode 96 of the capacitor 92 is connected to a source electrode 42Bs of the TFT device TR2 for driving. During a period selected by the TFT device TR1 for switching, charge is held, and a voltage generated by the charge is applied to the gate electrode 10Bg of the TFT device TR2 for driving. A drain current according to the voltage flows into the organic EL device to emit light from a pixel.

The TFT device for driving a display requires a capacitor which holds capacitance to drive the device. However, by directly forming the capacitor 92 in the resin layer 50, there is no need to provide an extra capacitor outside the flexible semiconductor device 180. Therefore, a small-size image display device mountable with high density can be realized.

Figure 17:
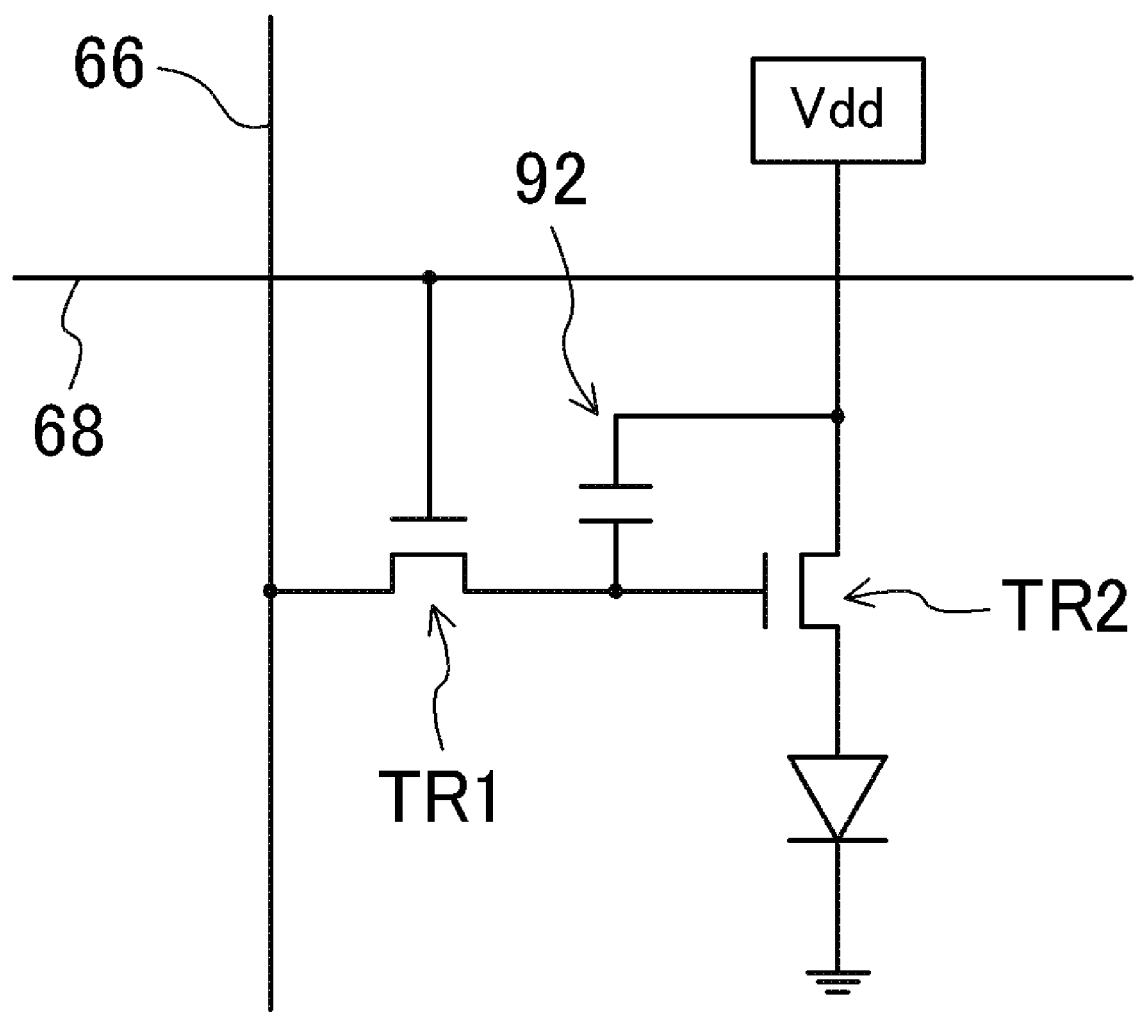
FIG. 17 is an equivalent circuit diagram of the flexible semiconductor device in the ninth embodiment.

FIG. 17 is an equivalent circuit diagram of the flexible semiconductor device 180 in this embodiment. A source electrode of the TFT device TR1 for switching is connected to a data line 66, and a gate electrode of the TFT device TR1 for switching is connected to a selection line 68. On the other hand, a gate electrode of the TFT device TR2 for driving is connected to a drain electrode of the TFT device TR1 for switching, and the capacitor 92 is connected between the drain electrode of the TFT device TR1 for switching and a drain electrode of the TFT device TR2 for driving.

While the flexible semiconductor device 180 in this embodiment is formed in each pixel of the image display device, not only two but also three or more TFT devices may be provided in each pixel, depending on the structure of the display.

Tenth Embodiment

Figure 18:
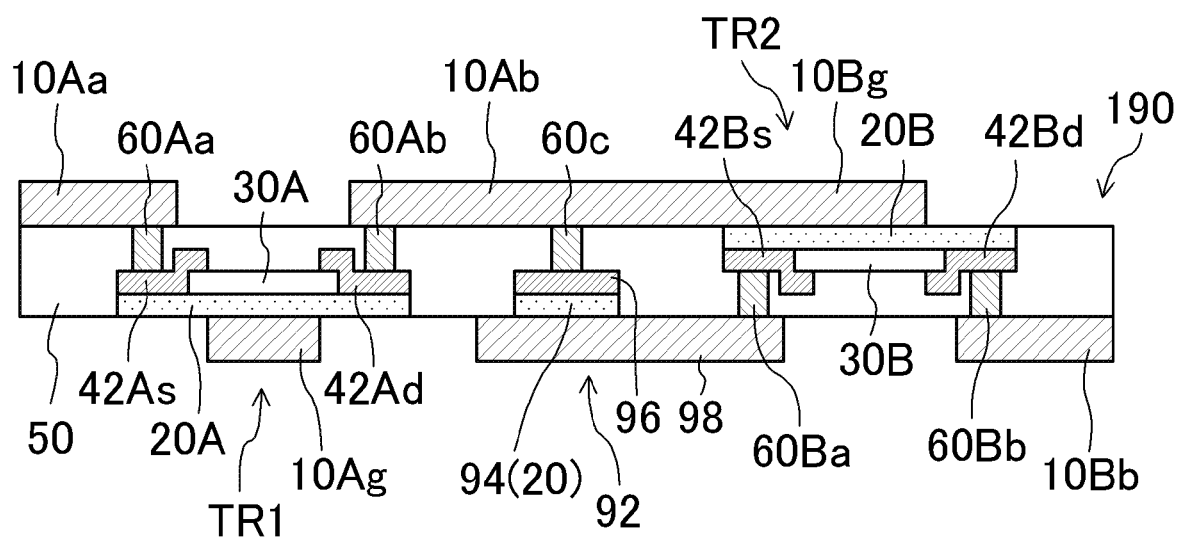
FIG. 18 is a cross-sectional view illustrating the structure of a flexible semiconductor device in a tenth embodiment of the present invention.

FIG. 18 is a cross-sectional view illustrating the structure of a flexible semiconductor device 190 in a tenth embodiment of the present invention. The flexible semiconductor device 190 in this embodiment differs from the structure in the ninth embodiment in that the first TFT device TR1 and the second TFT device TR2 are separately formed on both surfaces (the upper and lower surfaces in the figure) of the resin layer 50 to face each other.

In this embodiment, the first TFT device TR1 is a transistor for switching, and the second TFT device TR2 is a transistor for driving. In this case, the drain electrode 42Ad of the first TFT device TR1 may be electrically connected to the gate electrode 10Bg of the second TFT device TR2 through the interconnect 10Ab.

As such, since the first TFT device TR1 and the second TFT device TR2 are arranged to face each other with the resin layer 50 interposed therebetween, the floor area of the flexible semiconductor device 190 can be reduced as compared to the flexible semiconductor device 180 in which the devices TR1 and TR2 are arranged on the same surface. This also reduces the length of the interconnects to the devices TR1 and TR2, thereby reducing interconnection resistance. As a result, interconnection delay, in which rising and fall of signals are delayed, can be reduced. This advantage is significant particularly in an image display device with a large screen size, since the interconnect delay is large.

The flexible semiconductor device 190 may further include the capacitor 92. The capacitor 92 includes the upper electrode 96, the dielectric layer 94, and the lower electrode 98.

Next, a manufacturing method of the flexible semiconductor device 190 in this embodiment will be described with reference to FIGS. 19(a)-19(c).

Figure 19A:
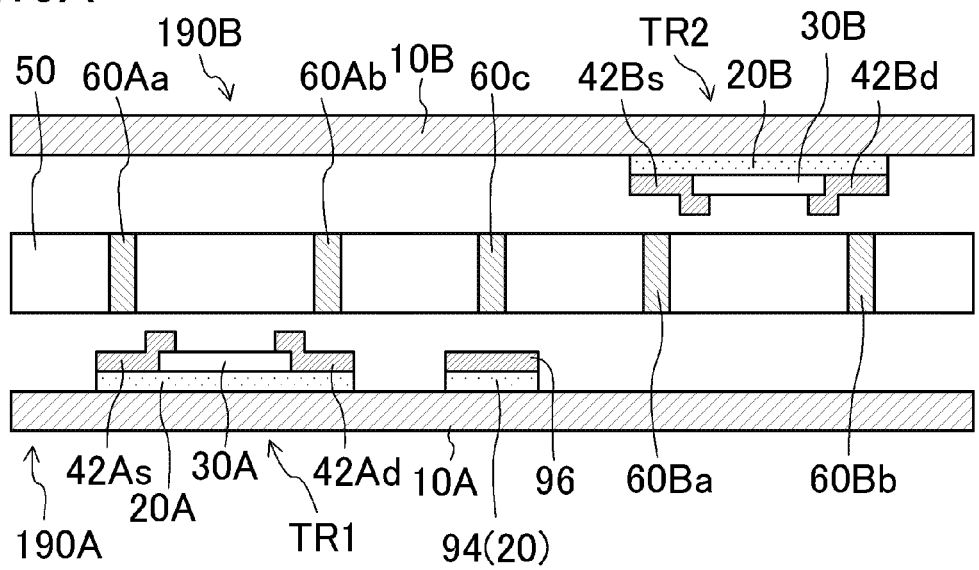
FIGS. 19(a)-19(c) are cross-sectional views illustrating steps in a manufacturing method of the flexible semiconductor device in the tenth embodiment.

First, as shown in FIG. 19(a), a first multilayer film 190A provided with the first TFT device TR1, a second multilayer film 190B provided with the second TFT device TR2, and the resin layer 50 provided with interlayer connections 60Aa, 60Ab, 60c, 60Ba, and 60Bb are prepared.

In the first multilayer film 190A, source/drain electrodes 42As and 42Ad of the first TFT device TR1 and the upper electrode 96 of the capacitor 92 are formed by etching the second metal layer 40. A gate insulating film 20A of the first TFT device TR1 and the dielectric layer 94 of the capacitor are formed by partially removing the inorganic insulating layer 20.

In the second multilayer film 190B, source/drain electrodes 42Bs and 42Bd of the second TFT device TR2 are formed by etching the second metal layer 40. Also, a gate insulating film 20B of the second TFT device TR2 is formed by partially removing the inorganic insulating layer 20.

Figure 19B:
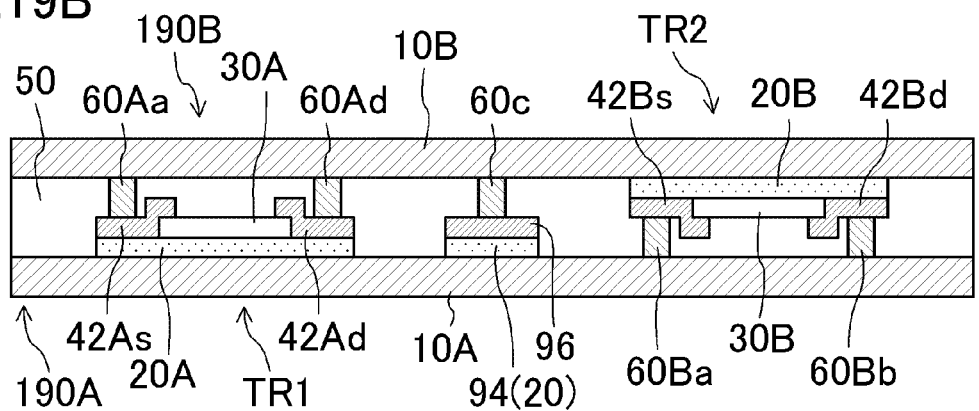

Then, as shown in FIG. 19(b), the surface (the upper surface in the figure) of the first multilayer film 190A provided with the semiconductor layer 30 is pressure-bonded onto one surface (the lower surface in the figure) of the resin layer 50 so that the first multilayer film 190A and the semiconductor layer 30 are integrated. At this time, the upper electrode 96 of the capacitor 92 is electrically connected to the interlayer connection 60c, the source electrode 42As of the first TFT device TR1 is electrically connected to the interlayer connection 60Aa, and the drain electrode 42Ad is electrically connected to the interlayer connection 60Ab.

Also, the surface (the lower surface in the figure) of the second multilayer film 190B provided with the semiconductor layer 30 is pressure-bonded onto the other surface (the upper surface in the figure) of the resin layer 50 so that the second multilayer film 190B and the resin layer 50 are integrated. At this time, a first metal layer 10B is electrically connected to the interlayer connections 60Aa, 60Ab, and 60c, the source electrode 42Bs of the second TFT device TR2 is electrically connected to an interlayer connection 60Ba, and a drain electrode 42Bd is electrically connected to an interlayer connection 60Bb.

In this embodiment, the first multilayer film 190A, the resin layer 50, and the second multilayer film 190B are layered in the same step. Specifically, as shown in FIG. 19(b), the first multilayer film 190A, the resin layer 50, and the second multilayer film 190B are aligned so that the interlayer connections 60Aa, 60Ab, 60c, 60Ba, and 60Bb are electrically connected together, and are then bonded and integrated. As a method of the integration, pressure application by roll lamination, vacuum lamination, hot press, and the like can be used as appropriate.

Figure 19C:
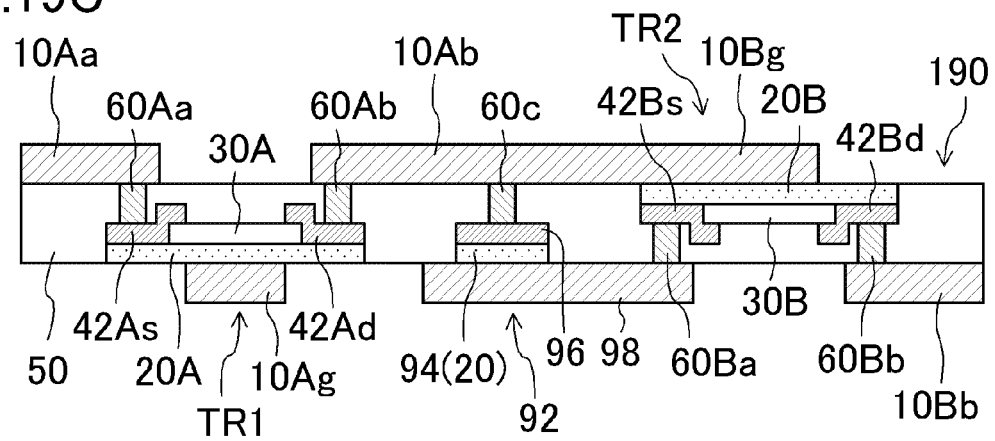

Next, as shown in FIG. 19(c), a gate electrode 10Ag of the first TFT device TR1, the lower electrode 98 of the capacitor 92, and an interconnect 10Bb are formed by etching a first metal layer 10A of the first multilayer film 190A. Also, the gate electrode 10Bg of the second TFT device TR2 and an interconnect 10Aa are formed by etching the first metal layer 10B of the second multilayer film 190B.

By the above-described method, the first TFT device TR1 and the second TFT device TR2 can be formed in the same process. Note that the etching of the first metal layer 10A in the first TFT device TR1, and the etching of the first metal layer 10B in the second TFT device TR2 are performed in a same step or different steps.

Eleventh Embodiment

Figure 20:
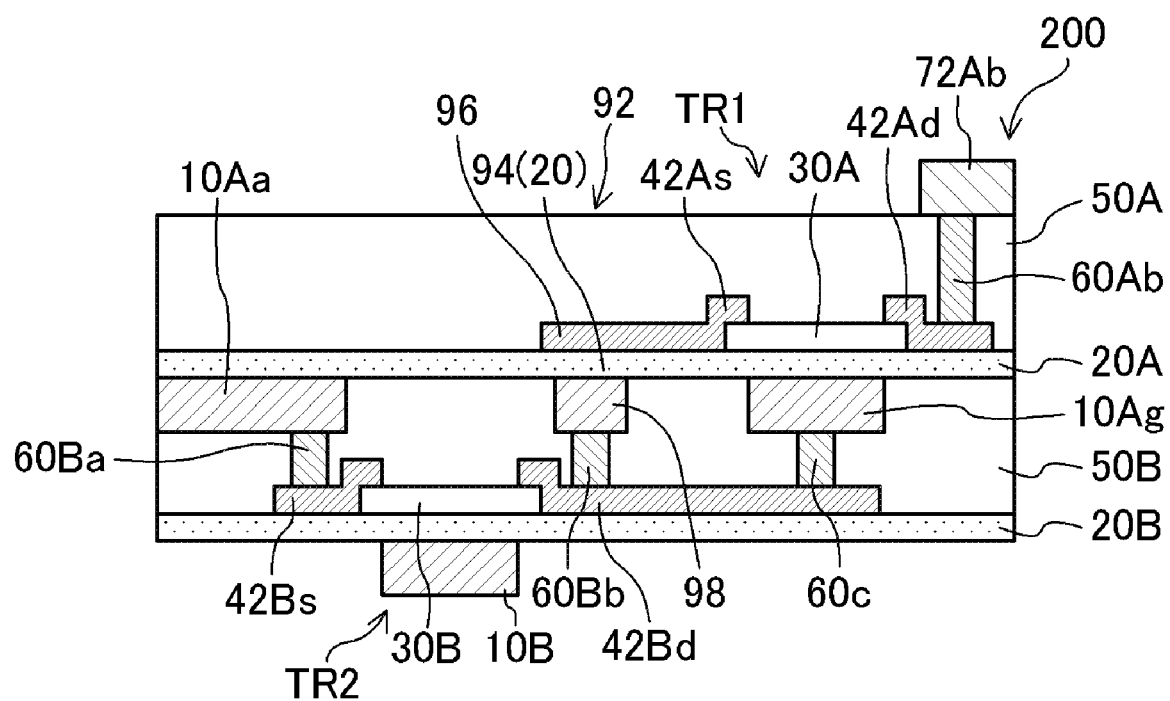
FIG. 20 is a cross-sectional view illustrating the structure of a flexible semiconductor device in an eleventh embodiment of the present invention.

FIG. 20 is a cross-sectional view illustrating the structure of a flexible semiconductor device 200 in an eleventh embodiment of the present invention. The flexible semiconductor device 200 in this embodiment differs from the structures in the ninth and tenth embodiments in that the first TFT device TR1, and the second TFT device TR2 are stacked as a multilayer.

A manufacturing method of the flexible semiconductor device 200 in this embodiment will be described below with reference to FIGS. 21(a)-21(c).

Figure 21A:
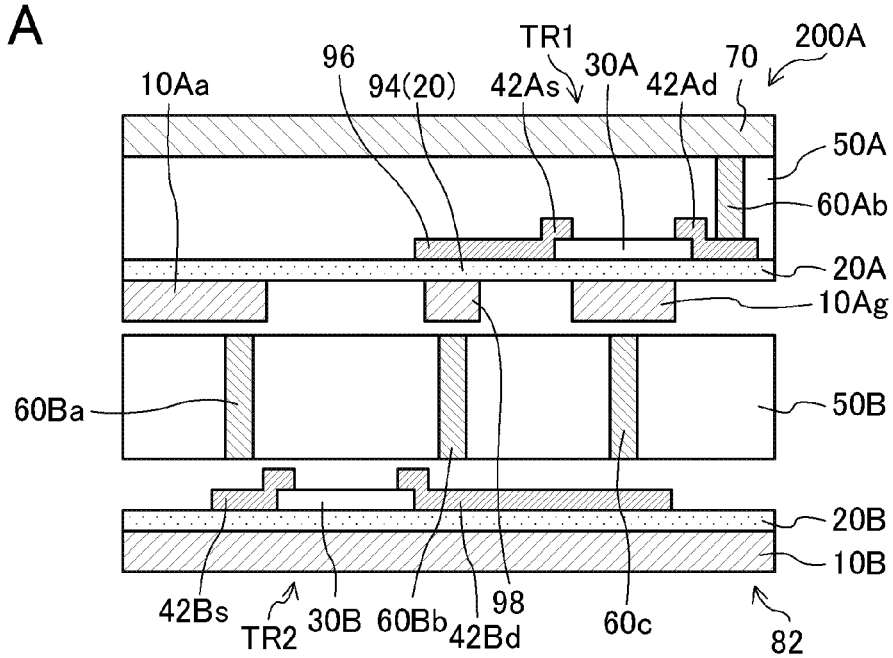
FIGS. 21(a)-21(c) are cross-sectional views illustrating steps in a manufacturing method of the flexible semiconductor device in the eleventh embodiment.

First, as shown in FIG. 21(a), a flexible semiconductor device 200A formed in the manufacturing method of the fifth embodiment and including the first TFT device TR1, the multilayer film 82 provided with the second TFT device TR2, and a resin layer 50B including the interlayer connections 60Ba, 60Bb, and 60c are prepared.

In the flexible semiconductor device 200A, the gate electrode 10Ag of the first TFT device TR1, and the lower electrode 98 of the capacitor 92 are formed by etching the first metal layer 10. Also, the source electrode 42As of the first TFT device TR1 is extended to form the upper electrode 96 of the capacitor 92, and the dielectric layer 94 of the capacitor 92 is comprised of an inorganic insulating layer 20A.

Furthermore, in the multilayer film 82, the source electrode 42Bs and the drain electrode 42Bd of the second TFT device TR2 are formed by etching the second metal layer 40.

Figure 21B:
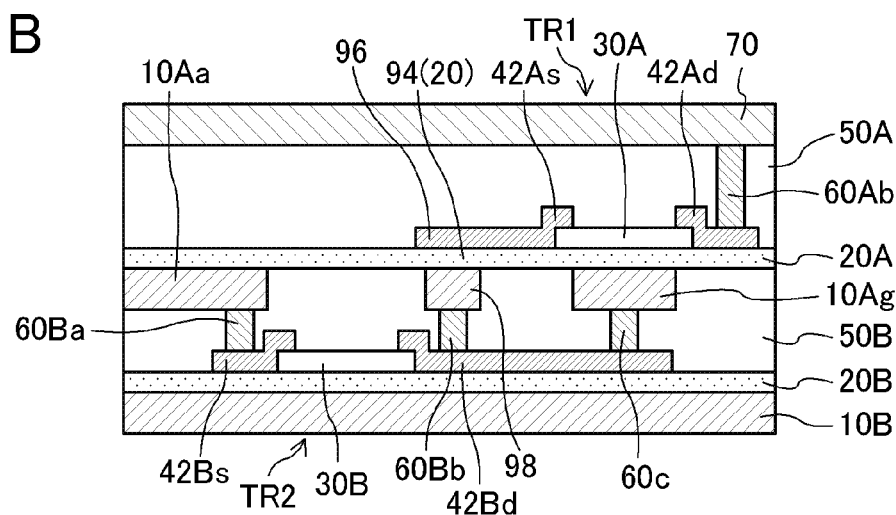

Then, as shown in FIG. 21(b), the surface (the upper surface in the figure) of the multilayer film 82 provided with a semiconductor layer 30B is pressure-bonded onto one surface (the lower surface in the figure) of the resin layer 50B so that the multilayer film 82 and the resin layer 50B are integrated. At this time, the source electrode 42Bs of the second TFT device TR2 is electrically connected to the interlayer connection 60Ba, the drain electrode 42Bd is electrically connected to the interlayer connection 60Bb, and an interconnect portion extending from the drain electrode 42Bd is electrically connected to the interlayer connection 60c.

Furthermore, the surface (the lower surface in the figure) of the flexible semiconductor device 200A provided with the gate electrode 10Ag etc. is pressure-bonded onto the other surface (the upper surface in the figure) of the resin layer 50 so that the flexible semiconductor device 200A and the resin layer 50 are integrated. At this time, the interconnect 10Aa of the flexible semiconductor device 200A is electrically connected to the interlayer connection 60Ba, the lower electrode 98 of the capacitor 92 is electrically connected to the interlayer connection 60Bb, and the gate electrode 10Ag is electrically connected to the interlayer connection 60c.

In this embodiment, the flexible semiconductor device 200, the resin layer 50B, and the multilayer film 82 are integrated in a same step. Specifically, as shown in FIG. 21(b), the flexible semiconductor device 200A, the resin layer 50, and the multilayer film 82 are aligned so that the interlayer connections 60Ba, 60Bb, and 60c are electrically connected together, and are then bonded and integrated.

Figure 21C:
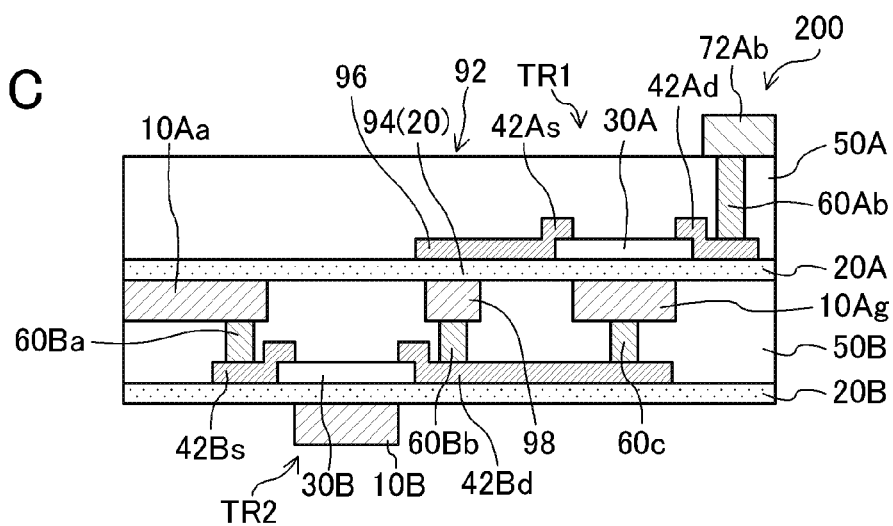

Next, as shown in FIG. 21(c), the interconnect 72Ab is formed by etching the third metal layer 70 of the flexible semiconductor device 200A. Also, the gate electrode 10Bg of the second TFT device TR2 is formed by etching the first metal layer 10B of the multilayer film 82. As such, the flexible semiconductor device 200, in which the first TFT device TR1 and the second TFT device TR2 are stacked, is completed.

As above, the present invention is described with reference to the preferable embodiments. However, the present invention is not limited to the description, and various changes and modifications are possible. For example, depending on the structure of a display, the number of TFT devices provided in each pixel is not limited to two, but may be three or more. In accordance with the number, the flexible semiconductor devices of the above embodiments can be changed or modified. Furthermore, in the above embodiments, examples have been described where a flexible semiconductor device is manufactured to correspond to a single device. However, the flexible semiconductor device may be manufactured to correspond to a plurality of devices. Such a device can be manufactured by a roll-to-roll method.

INDUSTRIAL APPLICABILITY

The present invention is particularly useful for a high-performance flexible semiconductor device mounted on a thin display and the like.

DESCRIPTION OF REFERENCE CHARACTERS

10 First Metal Layer
10a Interconnect
10g Gate Electrode
20 Inorganic Insulating Layer
20g Gate Insulating Film
30 Semiconductor Layer
30c Channel
34 Opening
40 Second Metal Layer
42d Drain Electrode
42s Source Electrode
44As, 44Ad Extending Portions
50 Resin Sheet (Resin Layer)
60a, 60b, 60c Interlayer Connections
62a, 62b, 62c Openings
63 Opening
66 Data Line
68 Selection Line
70 Third Metal Layer
72a, 72b Interconnects
74a, 74b, 74c Openings
80, 81, 82, 83 Multilayer Films
90 Diffusion Barrier Layer
92 Capacitor
94 Dielectric Layer
96 Upper Electrode
98 Lower Electrode
100, 110, 120, 130, 140 Flexible Semiconductor Devices
150, 160, 170, 180, 190 Flexible Semiconductor Devices
190A First Multilayer Film
190B Second Multilayer Film
200, 200A Flexible Semiconductor Device

The invention claimed is:

1. A manufacturing method of a flexible semiconductor device including a thin-film transistor, the method comprising the steps of:
   (a) preparing a multilayer film formed by sequentially stacking a first metal layer, an inorganic insulating layer, a semiconductor layer, and a second metal layer;
   (b) forming a source electrode and a drain electrode comprised of the second metal layer by etching a part of the second metal layer;
   (c) pressure-bonding a resin layer onto a surface of the multilayer film provided with the source electrode and the drain electrode to burry the source electrode and the drain electrode in the resin layer; and
   (d) forming a gate electrode comprised of the first metal layer by etching a part of the first metal layer, wherein the inorganic insulating layer on the gate electrode functions as a gate insulating film, and the semiconductor layer between the source electrode and the drain electrode on the inorganic insulating layer functions as a channel.

2. The manufacturing method of a flexible semiconductor device of claim 1, wherein
   in the step (c), the resin layer is a resin sheet.

3. The manufacturing method of a flexible semiconductor device of claim 1 further comprising
after the step (b), the step of removing the semiconductor layer by etching while retaining a region including at least the channel.

4. The manufacturing method of a flexible semiconductor device of claim 1, wherein
the step (c) includes the steps of
(c1) preparing the resin layer provided with a plurality of conductive interlayer connections penetrating both surfaces, and
(c2) pressure-bonding the resin layer onto the surface of the multilayer film provided with the source electrode and the drain electrode to bury the source electrode and the drain electrode in the resin layer, and to connect the source electrode and the drain electrode to the interlayer connections.

5. The manufacturing method of a flexible semiconductor device of claim 4 further comprising, after the step (b), the steps of:
removing the semiconductor layer by etching while retaining the region to be the channel to expose the inorganic insulating layer; and
etching a part of the exposed inorganic insulating layer to form an opening exposing the first metal layer, wherein
in the step (c2), the interlayer connections are connected to the first metal layer.

6. The manufacturing method of a flexible semiconductor device of claim 4 or 5 further comprising
after the step (c), the step of pressure-bonding a third metal layer onto a surface of the resin layer, and then etching the third metal layer to form an interconnect, wherein
the interconnect is electrically connected to the source electrode and the drain electrode and/or the first metal layer through the interlayer connections.

7. The manufacturing method of a flexible semiconductor device of any one of claims 4-6, wherein
the interlayer connections are paste vias.

8. The manufacturing method of a flexible semiconductor device of claim 1 further comprising, after the step (c), the steps of:
etching a part of a surface of the resin layer to form an opening exposing the source electrode and the drain electrode, and
forming a plated layer electrically connected to the source electrode and the drain electrode on a surface of the resin layer including at least the opening.

9. The manufacturing method of a flexible semiconductor device of claim 1, wherein
in the step (a), the semiconductor layer is patterned in advance in a region including at least the channel.

10. The manufacturing method of a flexible semiconductor device of claim 9, wherein
in the step (b), an upper electrode of a capacitor comprised of the second metal layer is formed together with the source electrode and the drain electrode by etching a part of the second metal layer,
in the step (d), a lower electrode of the capacitor comprised of the first metal layer is formed together with the gate electrode by etching a part of the first metal layer, and
the inorganic insulating layer between the upper electrode and the lower electrode functions as a dielectric layer of the capacitor.

11. The manufacturing method of a flexible semiconductor device of claim 1, wherein
in the step (a), a diffusion barrier layer is further provided between the semiconductor layer and the second metal layer.

12. A manufacturing method of a multilayer flexible semiconductor device comprising the steps of:
preparing a first flexible semiconductor device including a first thin-film transistor and a second flexible semiconductor device including a second thin-film transistor, which are manufactured by the method of claim 1;
preparing a resin layer provided with a plurality of conductive interlayer connections penetrating both surfaces, and
pressure-bonding the first flexible semiconductor device to the second flexible semiconductor device with the resin layer interposed therebetween, wherein
a gate electrode of the first thin-film transistor is electrically connected to a source electrode or a drain electrode of the second thin-film transistor through the interlayer connections.

13. A multilayer film used in the manufacturing method of a flexible semiconductor device of claim 1, wherein
the multilayer film is four-layer clad foil formed by sequentially stacking a first metal layer, an inorganic insulating layer, a semiconductor layer, and a second metal layer,
a source electrode and a drain electrode are formed by etching a part of the first metal layer,
a gate electrode is formed by etching a part of the second metal layer,
the inorganic insulating layer functions as a gate insulating film, and
the semiconductor layer functions as a channel.

14. The multilayer film of claim 13, wherein
the semiconductor layer is patterned in advance in a region including at least the channel.

15. The multilayer film of claim 13, wherein
a diffusion barrier layer is further provided between the semiconductor layer and the second metal layer.

16. The multilayer film of claim 15, wherein
the second metal layer is made of copper, and
the diffusion barrier layer is made of the material selected from the group consisting of titanium, titanium nitride, tantalum, and tantalum nitride.

* * * * *